(12) United States Patent
Chen et al.

(10) Patent No.: US 11,430,789 B2
(45) Date of Patent: Aug. 30, 2022

(54) SEMICONDUCTOR DEVICES WITH BACKSIDE CONTACTS AND ISOLATION

(71) Applicant: Taiwan Semiconductor Manufacturing Co., Ltd., Hsinchu (TW)

(72) Inventors: Chun-Yuan Chen, Hsinchu (TW); Huan-Chieh Su, Changhua County (TW); Cheng-Chi Chuang, New Taipei (TW); Chih-Hao Wang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/104,351

(22) Filed: Nov. 25, 2020

(65) Prior Publication Data

US 2022/0165733 A1  May 26, 2022

(51) Int. Cl.
*H01L 27/092* (2006.01)
*H01L 29/66* (2006.01)
(Continued)

(52) U.S. Cl.
CPC .. *H01L 27/0924* (2013.01); *H01L 21/823418* (2013.01); *H01L 21/823431* (2013.01);
(Continued)

(58) Field of Classification Search
CPC ......... H01L 27/0924; H01L 21/823418; H01L 21/823431; H01L 29/0653; H01L 29/66795; H01L 29/7851
See application file for complete search history.

(56) References Cited

U.S. PATENT DOCUMENTS 11,081,559 B1\* 8/2021 Liang ................. H01L 21/845
2019/0051729 A1\* 2/2019 Zhou ................. H01L 21/0262
(Continued)

OTHER PUBLICATIONS

Su, Huan-Chieh, et al. "Backside Power Rail And Methods Of Forming The Same," U.S. Appl. No. 16/901,963, filed Jun. 15, 2020, Assignee: Taiwan Semiconductor Manufacturing Co., Ltd., 29 pages specification, 22 pages drawings.
(Continued)

*Primary Examiner* — Karen Kusumakar
*Assistant Examiner* — Adam S Bowen
(74) *Attorney, Agent, or Firm* — Haynes and Boone, LLP

(57) ABSTRACT

A method includes forming a fin structure over a substrate, wherein the fin structure includes a base layer, an isolating layer over the base layer, and a stack of channel layers and first sacrificial layers alternately stacked over the isolating layer. The method further includes forming an isolation structure adjacent to sidewalls of the fin structure, wherein a top surface of the isolation structure is above a bottom surface of the isolating layer and below a top surface of the isolating layer. The method further includes depositing a second sacrificial layer over the isolation structure and over the sidewalls of the fin structure; etching the second sacrificial layer and the fin structure to form two source/drain trenches, wherein the source/drain trenches expose the base layer; partially removing the first and the second sacrificial layers through the source/drain trenches to form gaps; and depositing a dielectric spacer in the gaps.

20 Claims, 21 Drawing Sheets

(51) Int. Cl.
   H01L 21/8234    (2006.01)
   H01L 29/06      (2006.01)
   H01L 29/78      (2006.01)

(52) U.S. Cl.
   CPC .... H01L 29/0653 (2013.01); H01L 29/66795 (2013.01); H01L 29/7851 (2013.01)

(56) References Cited

U.S. PATENT DOCUMENTS

| | | | |
|---|---|---|---|
| 2020/0273753 A1* | 8/2020 | Loubet | H01L 21/02532 |
| 2020/0294998 A1* | 9/2020 | Lilak | H01L 29/42392 |
| 2021/0305420 A1* | 9/2021 | Frougier | H01L 29/775 |
| 2021/0398977 A1* | 12/2021 | Mishra | H01L 21/823807 |

OTHER PUBLICATIONS

Chiang, Kuo-Cheng, et al. "Semiconductor Devices With Backside Power Rail and Backside Self-Aligned Via," U.S. Appl. No. 17/080,521, filed Oct. 26, 2020, Assignee: Taiwan Semiconductor Manufacturing Co., Ltd., 37 pages specification, 24 pages drawings.

Chu, Feng-Ching, et al. "Epitaxial Source/Drain Feature with Enlarged Lower Section Interfacing with Backside Via," U.S. Appl. No. 16/901,631, filed Jun. 15, 2020, Assignee: Taiwan Semiconductor Manufacturing Co., Ltd., 35 pages specification, 23 pages drawings.

Chen, Chun-Yuan, et al. "Semiconductor Devices with Backside Air Gap Dielectric," U.S. Appl. No. 16/888,217, filed May 29, 2020, Assignee: Taiwan Semiconductor Manufacturing Co., Ltd., 27 pages specification, 16 pages drawings.

Ju, Shi Ning, et al. "Finfet Devices With Backside Power Rail and Backside Self-Aligned Via," U.S. Appl. No. 17/081,894, filed Oct. 27, 2020, Assignee: Taiwan Semiconductor Manufacturing Co., Ltd., 34 pages specification, 22 pages drawings.

Chen, Chun-Yuan, et al. "Anchor-Shaped Backside Via and Method Thereof," U.S. Appl. No. 16/926,447, filed Jul. 10, 2020, Assignee: Taiwan Semiconductor Manufacturing Co., Ltd., 32 pages specification, 16 pages drawings.

Huang, Lin-Yu, et al. "Selective Liner on Backside Via and Method Thereof," U.S. Appl. No. 16/944,263, filed Jul. 31, 2020, Assignee: Taiwan Semiconductor Manufacturing Co., Ltd., 30 pages specification, 36 pages drawings.

* cited by examiner

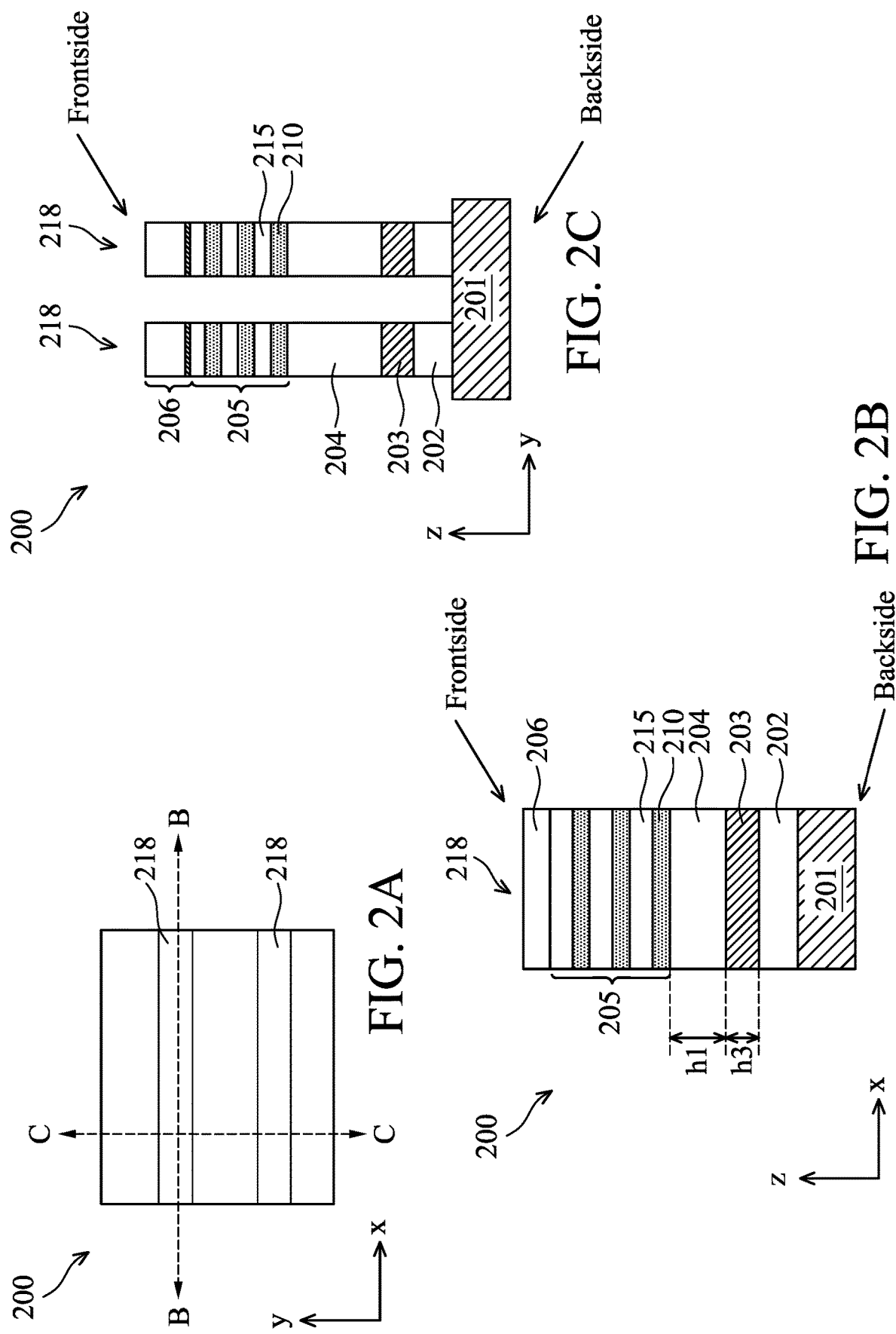

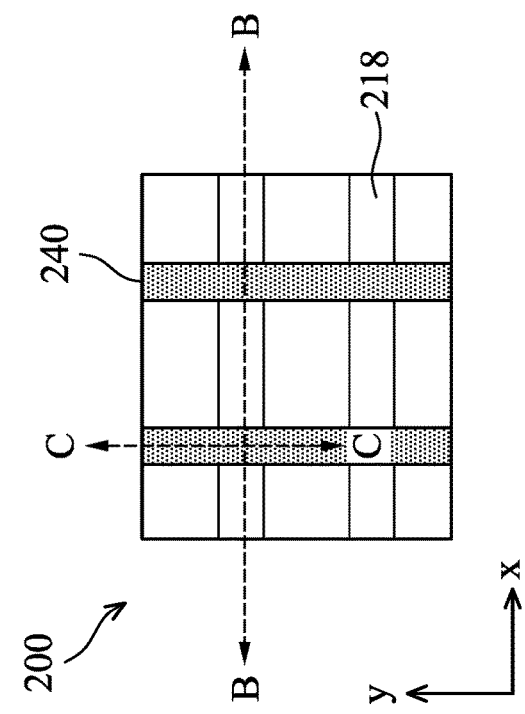
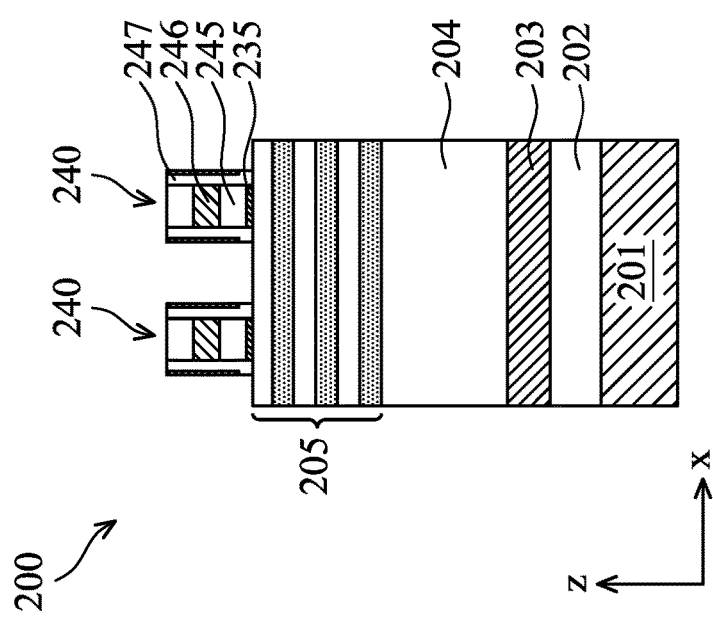
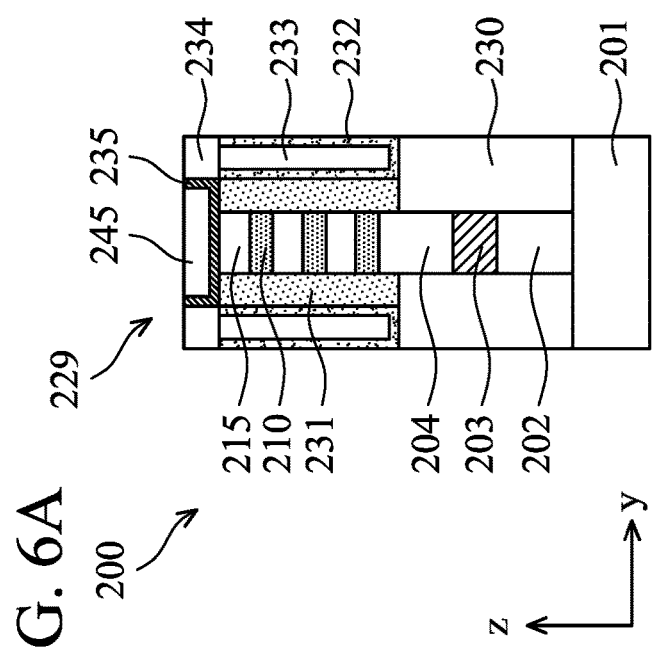
FIG. 6A
FIG. 6B
FIG. 6C

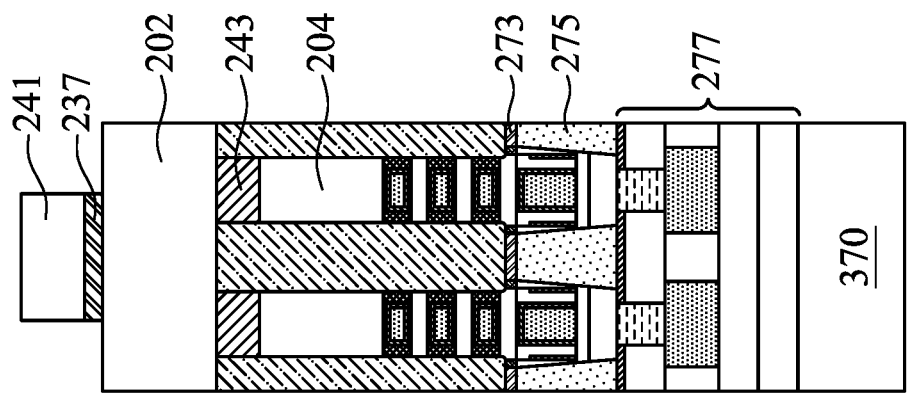
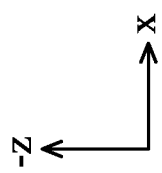
FIG. 14B
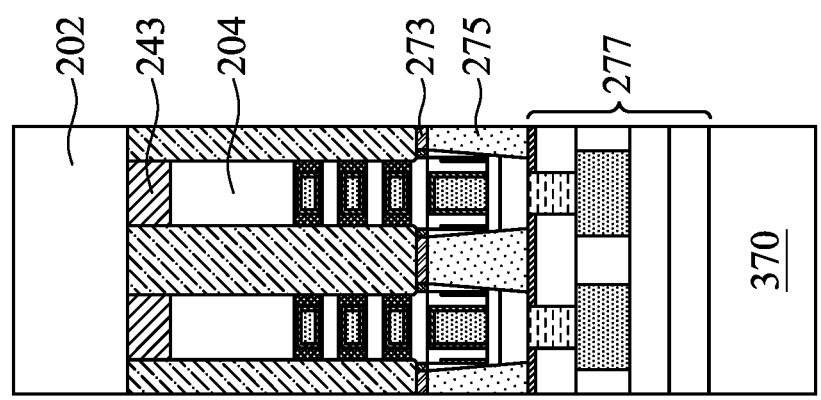
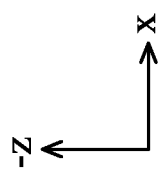
FIG. 14A

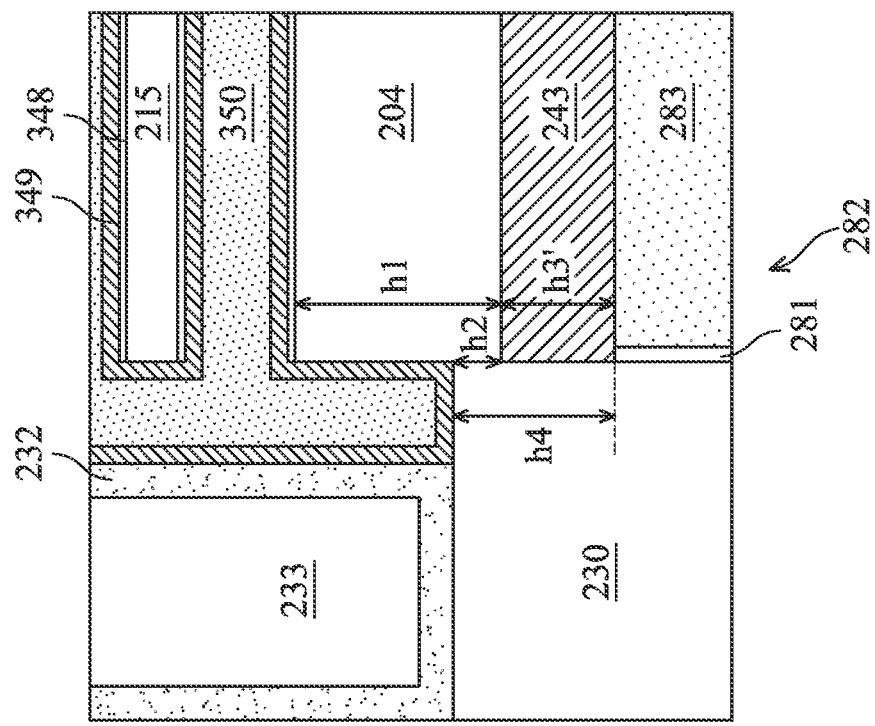
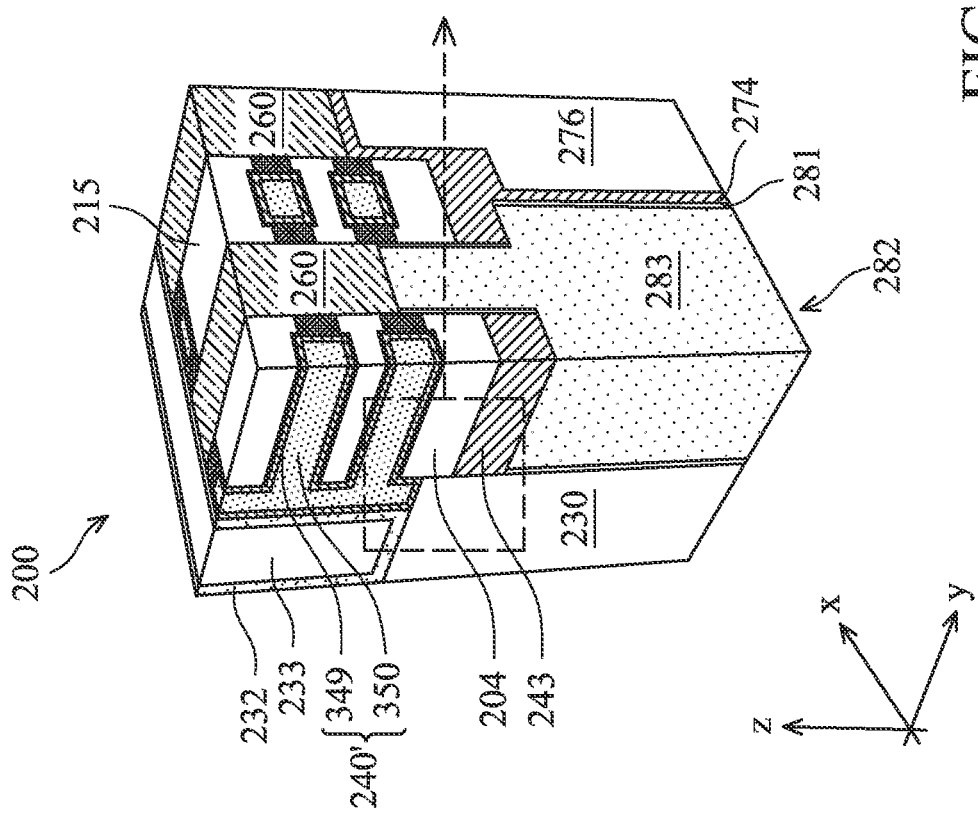
FIG. 15B

SEMICONDUCTOR DEVICES WITH BACKSIDE CONTACTS AND ISOLATION

BACKGROUND

Conventionally, integrated circuits (IC) are built in a stacked-up fashion, having transistors at the lowest level and interconnect (vias and wires) on top of the transistors to provide connectivity to the transistors. Power rails (e.g., metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits. Therefore, it is desirable to move some of the power rails to the backside of the transistors. One area of concerns is how to isolate such backside power rails from components of transistors, such as metal gates.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A illustrates a top view of a portion of a semiconductor device and FIGS. 2B and 2C illustrate cross-sectional views of the semiconductor device in FIG. 2A, in portion, along the B-B line and C-C line of FIG. 2A respectively, according to some embodiments.

FIG. 6A illustrates a top view of a portion of a semiconductor device and FIGS. 6B and 6C illustrate cross-sectional views of the semiconductor device in FIG. 6A, in portion, along the B-B line and C-C line of FIG. 6A respectively, according to some embodiments.

FIGS. 14A, 14B, 14C, 14D, 14E, and 14F illustrate cross-sectional views of a semiconductor device in FIG. 13A, in portion, along the B-B line of FIG. 13A, according to some embodiments.

FIGS. 15A and 15B illustrates a perspective view and a blown-up cross-sectional view of a semiconductor device according to some embodiments.

DETAILED DESCRIPTION

Figure 1A:
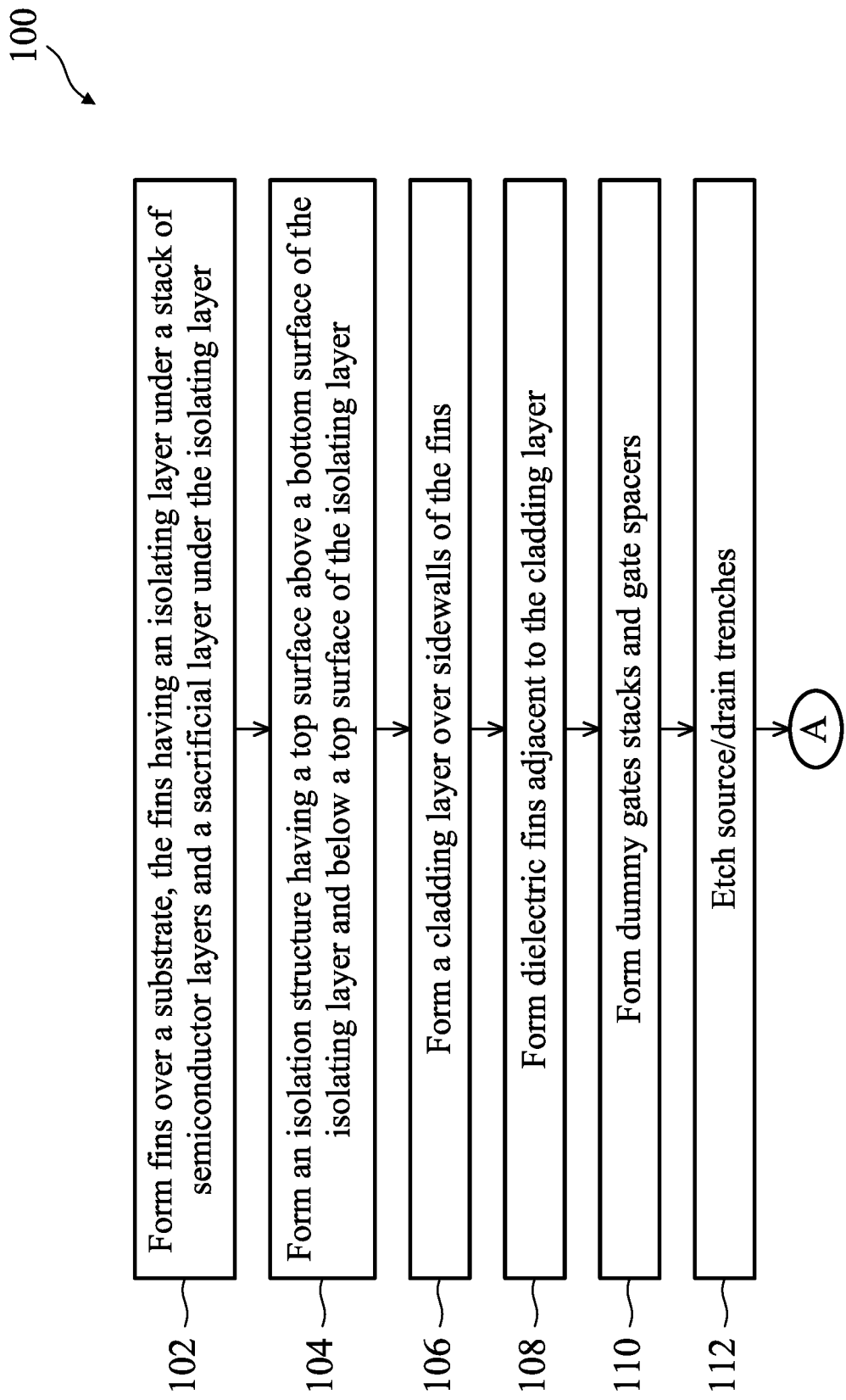
FIGS. 1A and 1B show a flow chart of a method of forming a semiconductor device with backside power rails and backside vias, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor devices with backside power rails and backside contacts (or vias). As discussed above, power rails in IC need further improvement in order to provide the needed performance boost as well as reducing power consumption. An object of the present disclosure includes providing power rails (or power routings) on a back side (or backside) of a structure containing transistors (such as gate-all-around (GAA) transistors) in addition to an interconnect structure (which may include power rails as well) on a front side (or frontside) of the structure. This increases the number of metal tracks available in the structure for directly connecting to source/drain contacts and vias. It also increases the gate density for greater device integration than existing structures without the backside power rails. The backside power rails may have wider dimension than the first level metal (M0) tracks on the frontside of the structure, which beneficially reduces the power rail resistance. The present disclosure also provides structures and methods for isolating the backside vias and backside power rails from nearby conductors such as metal gates. The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. Those of ordinary skill in the art should appreciate that they may readily use the present disclosure as a basis for designing or modifying other processes and structures for carrying out the same purposes and/or achieving the same advantages of the embodiments introduced herein.

Figure 1B:
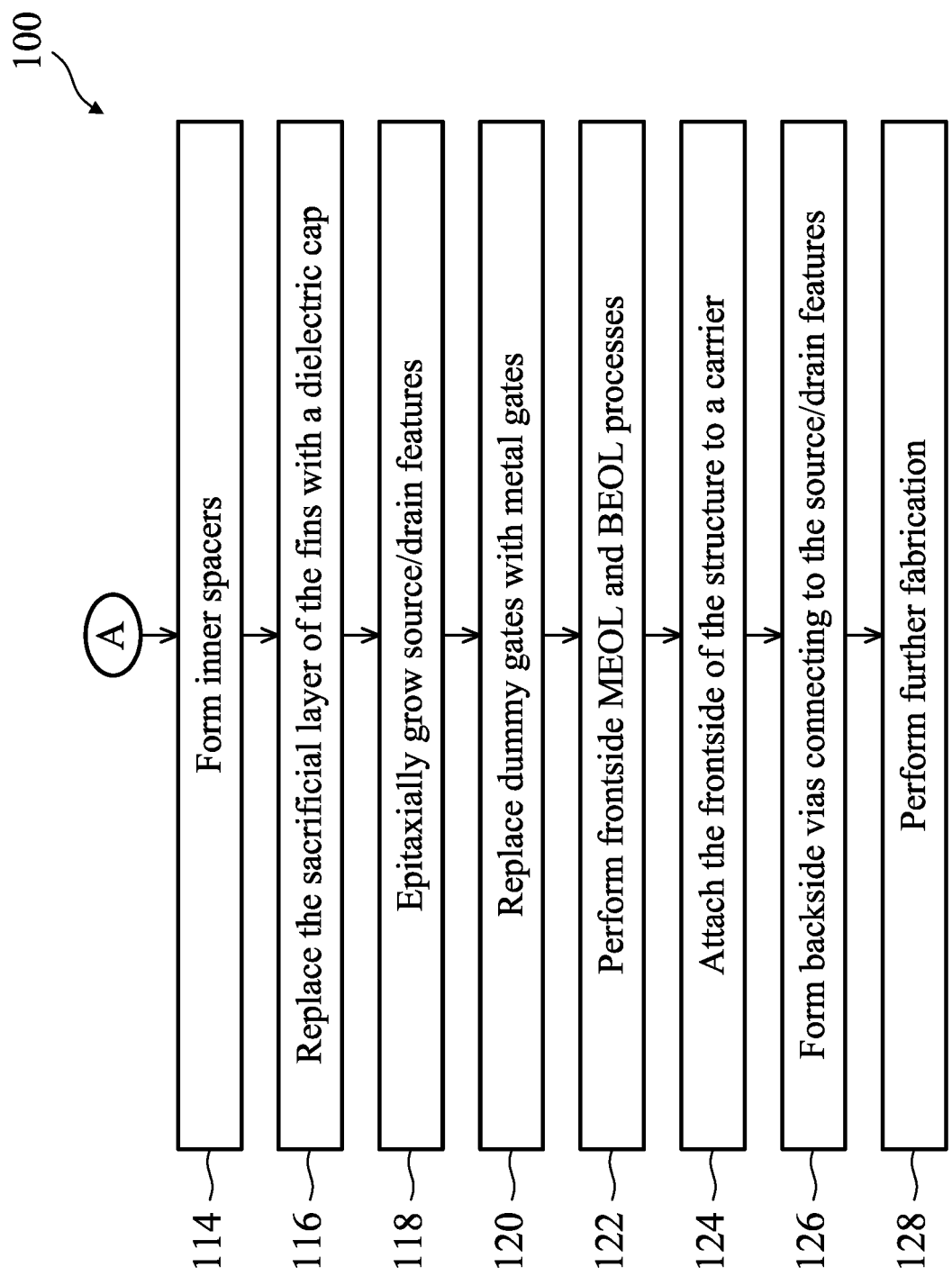

FIGS. 1A and 1B are a flow chart of a method 100 for fabricating a semiconductor device according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2A through FIG. 16 that illustrate various top, cross-sectional, and perspective views of a semiconductor device (or a semiconductor structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2A through 16 have been simplified for the sake of clarity to better understand the inventive concepts of the present disclosure. Additional features can be added in the device 200, and some of the features described below can be replaced, modified, or eliminated in other embodiments of the device 200.

At operation 102, the method 100 (FIG. 1A) forms fins 218 over a substrate 201, such as shown in FIGS. 2A, 2B, and 2C according to an embodiment. Referring to FIGS. 2A-2C, each fin 218 includes a stack of layers 202, 203, 204, 210, and 215 in the present embodiment. Particularly, the layer 202 extends from the substrate 201 and is referred to as a base layer 202 or a base fin layer 202 in the present disclosure. The layer 203 is disposed over the layer 202. As will be discussed, the layer 203 is replaced with a dielectric cap in a later fabrication step. Thus, it is also referred to as a sacrificial layer 203 or a sacrificial fin layer 203 in the present disclosure. In some embodiments, the layer 203 is omitted in the fin 218. The layer 204 is disposed over the layer 203 in the depicted embodiment. As will be discussed, the layer 204 functions to isolate metal gates from backside vias. Thus, it is also referred to as an isolating layer 204 or an isolating fin layer 204 in the present disclosure. In embodiments where the layer 203 is omitted in the fin 218, the layer 204 is disposed directly on the layer 202. The layers 210 and 215 include semiconductor materials and are alternately stacked one over another to form a semiconductor layer stack 205. The semiconductor layer stack 205 is disposed over the isolating layer 204. As will be discussed, the layer 210 is removed in a later fabrication step to form suspended channel layers 215. Thus, it is also referred to as a sacrificial layer 210 or a sacrificial fin layer 210 in the present disclosure. The fins 218 may include other layers not shown in FIGS. 2B and 2C in various embodiments. FIGS. 2B and 2C further show a hard mask layer 206 over the fins 218. The fins 218 and the hard mask layer 206 are disposed over a front surface of the substrate 201. In the present disclosure, the side of the structure 200 where the fins 218 are located is referred to as the frontside of the structure 200 and the side of the structure 200 opposite to the frontside with respect to the substrate 201 is referred to as the backside of the structure 200. The various components of the structure 200 are further described below.

In an embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In some embodiments, the base layer 202 includes the same material as the substrate 201. For example, the base layer 202 includes silicon when the substrate 201 includes bulk silicon or silicon on insulator. The sacrificial layer 203 includes a material that is different than the materials in the layers 202, 204, 210, and 215 to achieve etch selectivity in a subsequent fabrication step where it is replaced with a dielectric cap. For example, the base layer 202, the isolating layer 204, and the channel layers 215 may include silicon and the sacrificial layers 203 and 210 may include silicon germanium with different atomic percent to achieve the desired etch selectivity. For example, the sacrificial layer 203 may include silicon germanium with germanium atomic percent in a range of 5% to 15% while the sacrificial layer 210 may include silicon germanium with germanium atomic percent in a range of 35% to 55%. In various embodiments, the sacrificial layer 203 can comprise silicon, silicon germanium, germanium, or other suitable semiconductor. Further, the sacrificial layer 203 has a thickness h3 (along the "z" direction) that is in a range of 0 nm (i.e., the sacrificial layer 203 is omitted) to about 30 nm in some embodiments.

In various embodiments, the isolating layer 204 includes undoped silicon, other undoped semiconductor, or a dielectric material such as a dielectric material having silicon, oxygen, and nitrogen (silicon oxynitride) to function as an insulator between two conductors. Further, the isolating layer 204 has a thickness h1 (along the "z" direction) that is in a range of about 8 nm to about 40 nm such as from about 10 nm to about 20 nm in some embodiments. As will be discussed, the thickness h1 is one of factors that determine a distance between backside vias and metal gates, which in turn affects the TDDB (Time Dependent Dielectric Breakdown) performance of the device 200. Therefore, the layer 204 is generally desired to be thick. If the isolating layer 204 is too thin (such as less than 8 nm), the TDDB performance of the device 200 might suffer in some instances. However, if the isolating layer 204 is too thick (such as greater than 40 nm), the backside vias might be long and narrow in some instances, which would increase the S/D contact resistance.

The semiconductor layer stack 205 includes semiconductor layers 210 and semiconductor layers 215 stacked vertically (e.g., along the z-direction) in an interleaving or alternating configuration. In some embodiments, semiconductor layers 210 and semiconductor layers 215 are epitaxially grown in the depicted interleaving and alternating configuration. Epitaxial growth of semiconductor layers 210 and semiconductor layers 215 may be achieved by a molecular beam epitaxy (MBE) process, a chemical vapor deposition (CVD) process, a metalorganic chemical vapor deposition (MOCVD) process, other suitable epitaxial growth process, or combinations thereof. A composition of semiconductor layers 210 is different than a composition of semiconductor layers 215 to achieve etching selectivity and/or different oxidation rates during subsequent processing. For example, semiconductor layers 210 and semiconductor layers 215 may include different materials, constituent atomic percentages, constituent weight percentages, thicknesses, and/or characteristics to achieve desired etching selectivity and/or different oxidation rates. For example, semiconductor layers 210 include silicon germanium and semiconductor layers 215 include silicon, in an embodiment. In some embodiments, semiconductor layers 210 and semiconductor layers 215 can include the same material but with different constituent atomic percentages to achieve the etching selectivity and/or different oxidation rates. For example, both semiconductor layers 210 and 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of the device 200. In the depicted embodiment, semiconductor layer stack 205 includes three semiconductor layers 210 and three semiconductor layers 215. After undergoing subsequent processing, such configuration will result in the device 200 having three channels. However, the present disclosure contemplates embodiments where semiconductor layer stack 205 includes more or less semiconductor layers, for example, depending on a number of channels desired for the device 200. For example, semiconductor layer stack 205 can include two to ten semiconductor layers 210 and two to ten semiconductor layers 215.

As illustrated in FIG. 2A, the fins 218 are oriented lengthwise along the "x" direction. The fins 218 may be patterned by any suitable method. For example, the fin 218 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stack 205 and patterned using a photolithography process. Spacers are formed alongside the patterned sacrificial layer using a self-aligned process. The sacrificial layer is then removed, and the remaining spacers, or mandrels, may then be used as the hard mask 206 for patterning the fins 218. For example, the hard mask 206 may be used for etching recesses into the layers 215, 210, 204, 203, and 202, leaving the fins 218 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 218 may be suitable.

Figure 3:
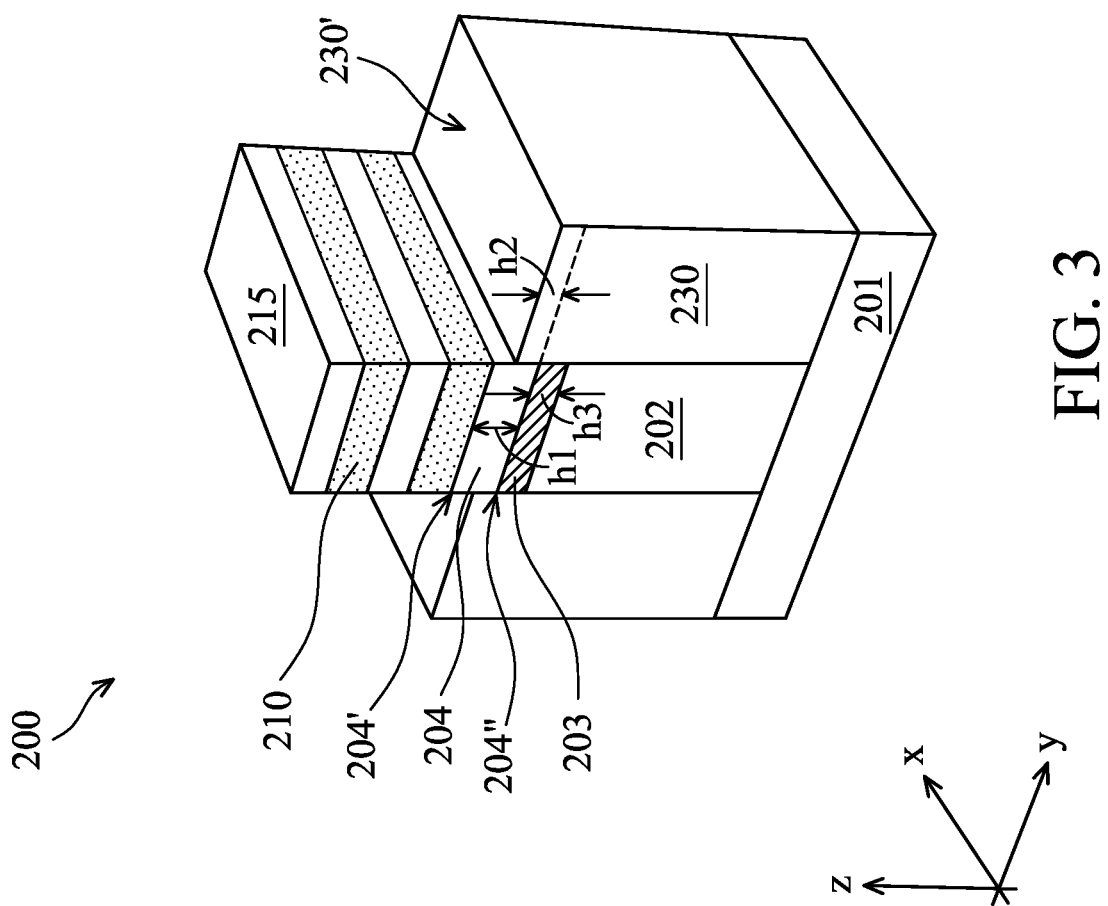
FIGS. 3, 4, and 5 illustrate perspective views of a portion of a semiconductor device during fabrication according to some embodiments.

At operation 104, the method 100 (FIG. 1A) forms an isolation structure 230 over the substrate 201 and isolating the fins 218, an embodiment of which is illustrated in FIG. 3. Referring to FIG. 3, the isolation structure 230 surrounds a bottom portion of fins 218 to separate and isolate fins 218 from each other. The isolation structure 230 may include silicon oxide, silicon nitride, silicon oxynitride, other suitable isolation material (for example, including silicon, oxygen, nitrogen, carbon, or other suitable isolation constituent), or combinations thereof. The isolation structure 230 can include different structures, such as shallow trench isolation (STI) structures and/or deep trench isolation (DTI) structures. In some embodiments, the isolation structure 230 includes a multi-layer structure, such as having an oxide liner layer on sidewalls of the fins 218 and the top surface of the substrate 201 and a silicon nitride layer disposed over the oxide liner layer. In an embodiment, the isolation structure 230 can be formed by filling the trenches between fins 218 with insulator material (for example, by using a CVD process or a spin-on glass process), performing a chemical mechanical polishing (CMP) process to remove excessive insulator material and/or planarize a top surface of the insulator material layer, and etching back the insulator material layer to form the isolation structure 230.

In the present embodiment, the etching back of the insulator material is controlled such that the top surface 230' of the isolation structure 230 is below the top surface 204' of the isolating layer 204 and above the bottom surface 204" of the isolating layer 204. Specifically, the top surface 230' of the isolation structure 230 is above the bottom surface 204" of the isolating layer 204 by a vertical distance h2. As will be discussed, the distance h2 is one of factors that determine a distance between backside vias and metal gates, which in turn affects the TDDB performance of the device 200. Therefore, the distance h2 is desired to be big enough to satisfy TDDB design goals. In some embodiments, the distance h2 is controlled to be in a range of about 8 nm to about 20 nm. If the distance h2 is too small (such as less than 8 nm), the TDDB performance of the device 200 might suffer in some instances. However, if the distance h2 is too large (such as greater than 20 nm), the backside vias might be long and narrow in some instances, which would increase the S/D contact resistance. To achieve the desired distance h2, the thickness h1 of the isolating layer 204 is designed to be greater than the distance h2 and to accommodate any process variations in the formation of the isolation structure 230. For example, when the isolation structure 230 is etched back, the depth of etching needs to be controlled (for example, by a timer or other means) to reach the desired depth as discussed above. The depth of etching may vary among different areas of a wafer or from wafer to wafer. The thickness h1 of the isolating layer 204 is designed to be large enough (such as in a range of about 8 nm to 40 nm as discussed above) to accommodate such variations and still allow the distance h2 to be in a desired range as discussed above, such as from about 8 nm to about 20 nm.

Figure 4:
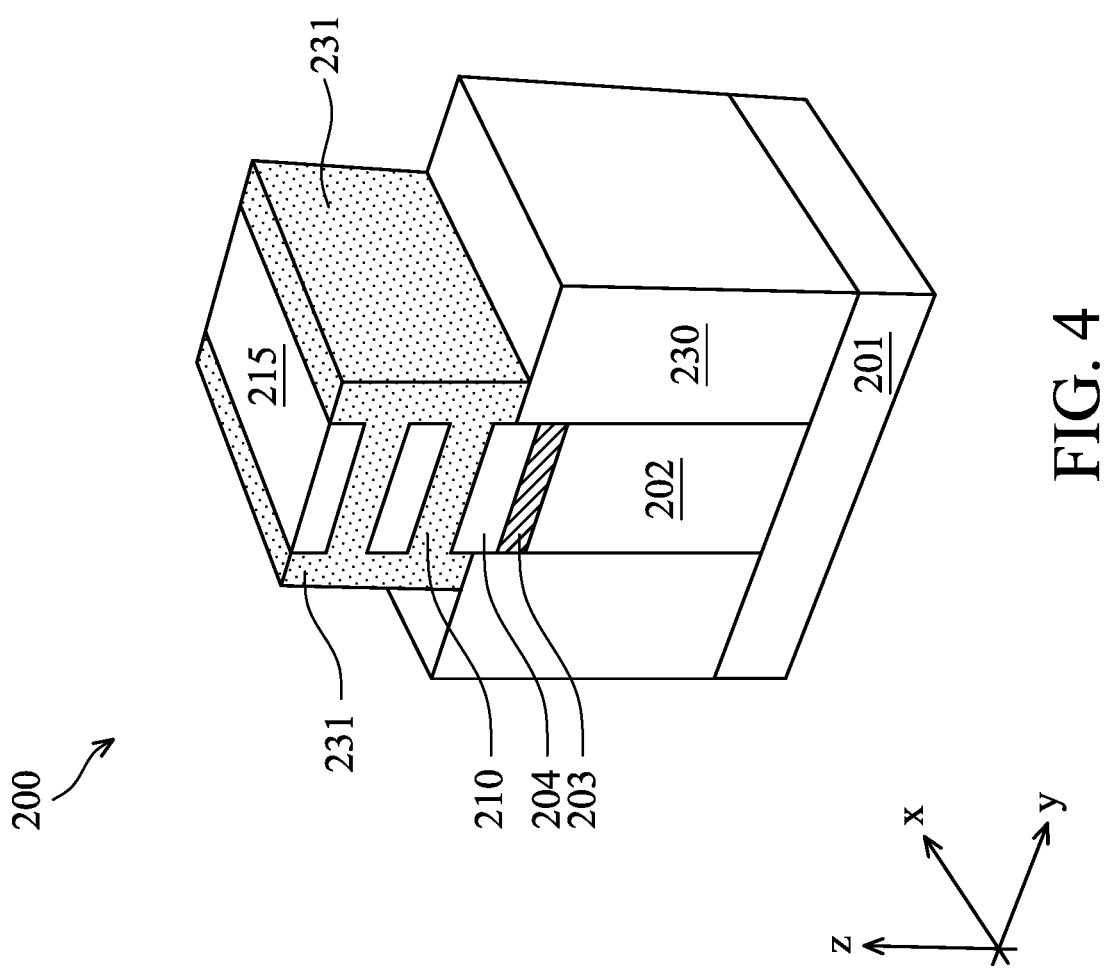

At operation 106, the method 100 (FIG. 1A) forms a cladding layer 231 over the sidewall surfaces of the fins 218 and above the isolation features 230, an embodiment of which is shown in FIG. 4. In the present embodiment, the cladding layer 231 will be removed in later fabrication steps. Thus, it is also a sacrificial layer. In an embodiment, the cladding layer 231 includes a semiconductor material that is the same as or substantially the same as the materials included in the semiconductor layer 210. For example, the materials in the cladding layer 231 and the semiconductor layer 210 are substantially same or similar such that they may be etched by a same etchant at about the same etch rate. Further, the materials in the cladding layer 231 and the sacrificial fin layer 203 are different to achieve etch selectivity. In an embodiment, both the semiconductor layer 210 and the cladding layer 231 include silicon germanium with about the same germanium atomic percent, and the sacrificial fin layer 203 includes silicon germanium with a much lower germanium atomic percent than that in the layers 210 and 231. For example, the semiconductor layer 210 and the cladding layer 231 may include silicon germanium with germanium atomic percent in a range of about 35% to 55%, and the sacrificial fin layer 203 includes silicon germanium with germanium atomic percent in a range of about 5% to 15% in some embodiments. The cladding layer 231 may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. In an embodiment, the operation 106 first deposits the cladding layer 231 over the top and sidewalls of the fins 218 and over the top surface of the isolation structure 230, and then etches it back to remove the portion of the cladding layer 231 from above the isolation features 230, for example, using a plasma dry etching process.

Figure 5:
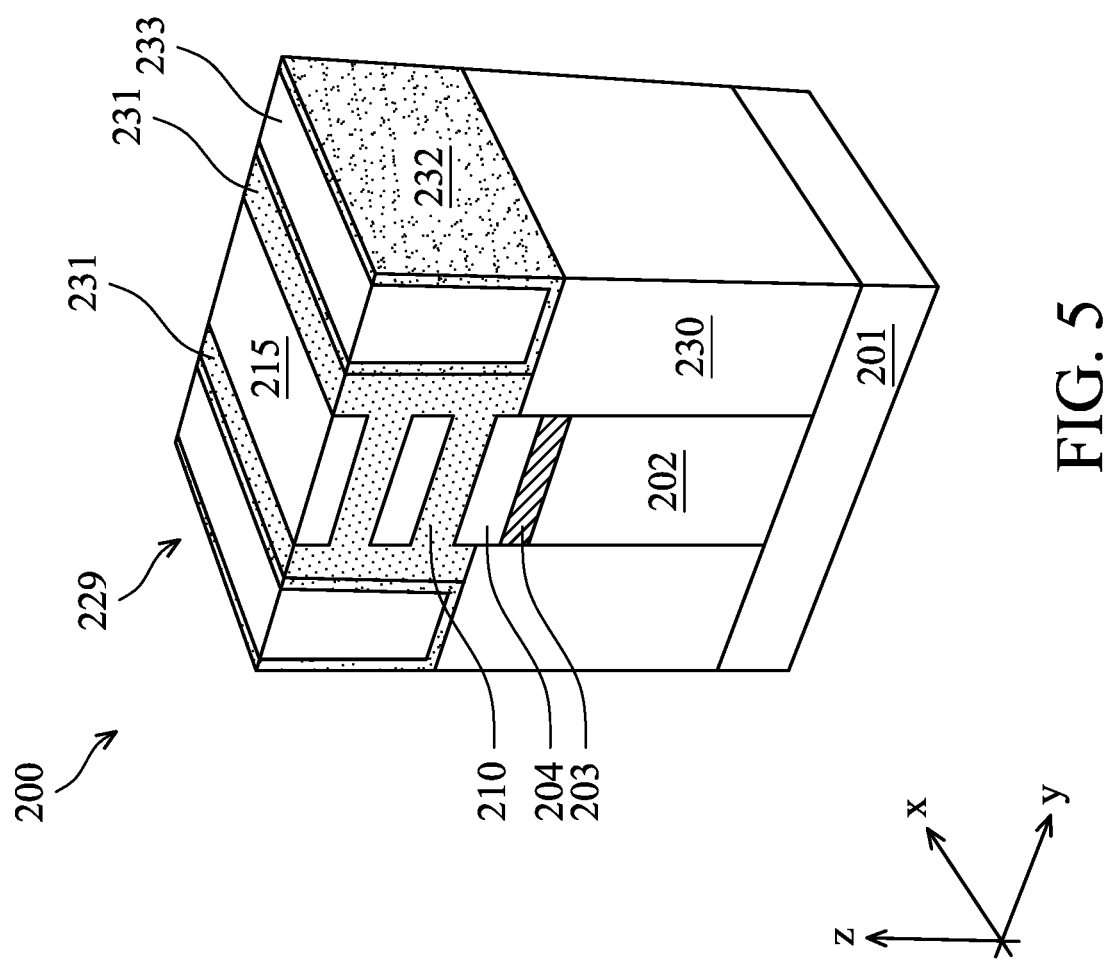

At operation 108, the method 100 (FIG. 1A) forms dielectric fins 229 over the isolation structure 230 and adjacent to the cladding layer 231. Referring to FIG. 5, the dielectric fins 229 include a dielectric liner 232 and a dielectric fill layer 233 in the depicted embodiment. The dielectric liner 232 is disposed over the sidewalls of the cladding layer 231 and on top surfaces of the isolation features 230, and the dielectric fill layer 233 is disposed over the dielectric liner 232 and fills the gaps between the fins 218. In an embodiment, the dielectric liner 232 includes a low-k dielectric material such as a dielectric material including Si, O, N, and C. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, or combinations thereof. Low-k dielectric material generally refers to dielectric materials having a low dielectric constant, for example, lower than that of silicon oxide (k≈3.9). The dielectric liner 232 may be deposited using CVD, PVD, ALD, HDPCVD, MOCVD, RPCVD, PECVD, LPCVD, ALCVD, APCVD, other suitable methods, or combinations thereof. In an embodiment, the dielectric fill layer 233 includes silicon oxide, silicon nitride, silicon oxynitride, TEOS formed oxide, PSG, BPSG, low-k dielectric material, other suitable dielectric material, or combinations thereof. The dielectric fill layer 233 may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 233 may be deposited using other types of methods. After the layers 232 and 233 are deposited, the operation 106 may perform a CMP process to planarize the top surface of the device 200 and to expose the cladding layer 231.

The dielectric fins 229 may further includes a dielectric helmet 234, such as shown in FIG. 6C. In an embodiment, the dielectric helmet 234 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The dielectric helmet 234 is formed by any of the processes described herein, such as ALD, CVD, PVD, oxidation-based deposition process, other suitable process, or combinations thereof. In an embodiment, the operation 108 includes recessing the dielectric layers 232 and 233 using a selective etching process that etches the dielectric layers 232 and 233. Then, the operation 108 deposits one or more dielectric materials into the recesses and performs a CMP process to the one or more dielectric materials to form the dielectric helmet 234. The hard mask layer 206 (FIGS. 2B and 2C) may be removed during or after the formation of the dielectric fins 229.

At operation 110, the method 100 (FIG. 1A) forms dummy (or sacrificial) gate stacks 240 over the fins 218. Referring to FIG. 6A, the dummy gate stacks 240 are oriented lengthwise perpendicular to the fins 218. the dummy gate stacks 240 include a dummy gate dielectric layer 235, a dummy gate electrode layer 245, and one or more hard mask layers 246. In the present embodiment, the dummy gate stacks 240 will be replaced with functional gate stacks 240' in a later fabrication step. In some embodiments, the dummy gate dielectric 235 includes a dielectric material, such as silicon oxide, a high-k dielectric material, other suitable dielectric material, or combinations thereof; the dummy gate electrode layer 245 includes polysilicon or other suitable material; and the one or more hard mask layers 246 include silicon oxide, silicon nitride, or other suitable materials. Dummy gate stacks 240 are formed by deposition processes, lithography processes, etching processes, other suitable processes, or combinations thereof. For example, the layers 235, 245, and 246 may be deposited using CVD, PVD, ALD, or other suitable methods. Then, a lithography patterning and etching process is performed to pattern the layers 235, 245, and 246 to form dummy gate stacks 240, as depicted in FIGS. 6A-6C. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

In the present embodiment, the operation 110 further forms gate spacers 247 on sidewalls of the dummy gate stacks 240 (as shown in FIG. 6B). Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 240 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 240. In such implementations, the various sets of spacers can include materials having different etch rates. For example, a first dielectric layer including silicon and oxygen (e.g., silicon oxide) can be deposited and etched to form a first spacer set adjacent to dummy gate stacks 240, and a second dielectric layer including silicon and nitrogen (e.g., silicon nitride) can be deposited and etched to form a second spacer set adjacent to the first spacer set.

Figure 7B:
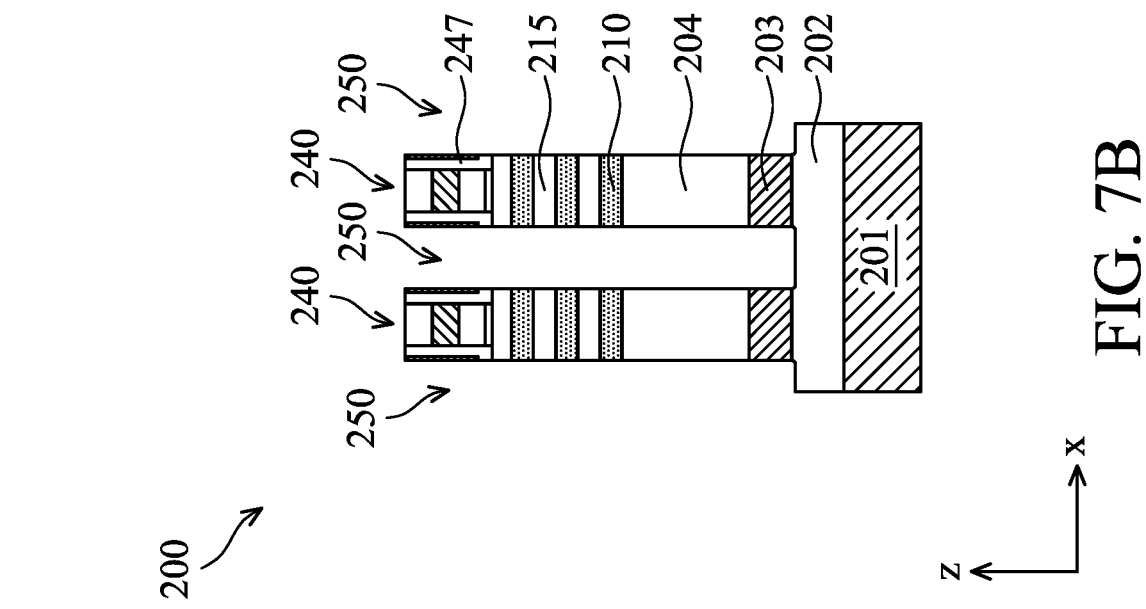
FIGS. 7B, 8B, and 9B illustrate cross-sectional views of a portion of the semiconductor device in FIGS. 7A, 8A, and 9A, respectively, along the B-B line of FIG. 6A according to some embodiments.
Figure 7A:
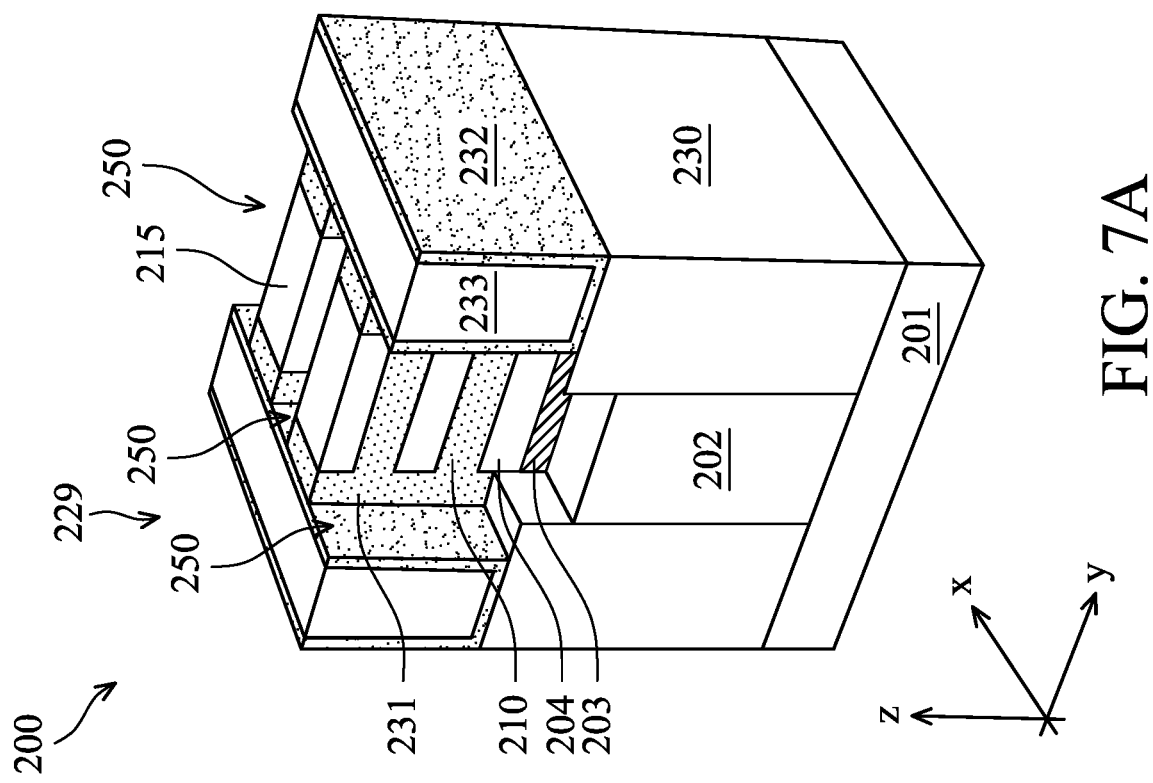
FIGS. 7A, 8A, and 9A illustrate perspective views of a portion of a semiconductor according to some embodiments.

At operation 112, the method 100 (FIG. 1A) forms source/drain (S/D) trenches 250 by etching the fins 218 and the cladding layer 231 adjacent the gate spacers 247. The resultant structure is shown in FIGS. 7A-7B according to an embodiment. In the depicted embodiment, an etching process completely etches through the cladding layer 231, the semiconductor layer stack 205, the isolating layer 204, and the sacrificial layer 203 in S/D regions of fins 218, thereby exposing the base layer 202 in the S/D regions. The base layer 202 may be partially etched in some embodiments. The etching process can include a dry etching process, a wet etching process, other suitable etching process, or combinations thereof. In some embodiments, the etching process is a multi-step etch process. For example, the etching process may alternate etchants to separately remove the layers 210, 215, 204, and 203 in a sequence of etching steps. In an embodiment, the cladding layer 231 and the semiconductor layer 210 include about the same material(s), therefore the etchant designed to etch the semiconductor layer 210 also etches the cladding layer 231. In some embodiments, parameters of the etching process are configured to selectively etch the various layers of the fins 218 and the cladding layer 231 with minimal (to no) etching of the gate stacks 240, the gate spacers 247, the dielectric fins 229, and the isolation structure 230. In those embodiments, the S/D trenches 250 are confined in a space that is defined by the gate stacks 240, the gate spacers 247, the dielectric fins 229, and the isolation structure 230. In some embodiments, a lithography process, such as those described herein, is performed to form a patterned mask layer that covers gate stacks 240 and/or isolation features 230, and the etching process uses the patterned mask layer as an etch mask.

Figure 8B:
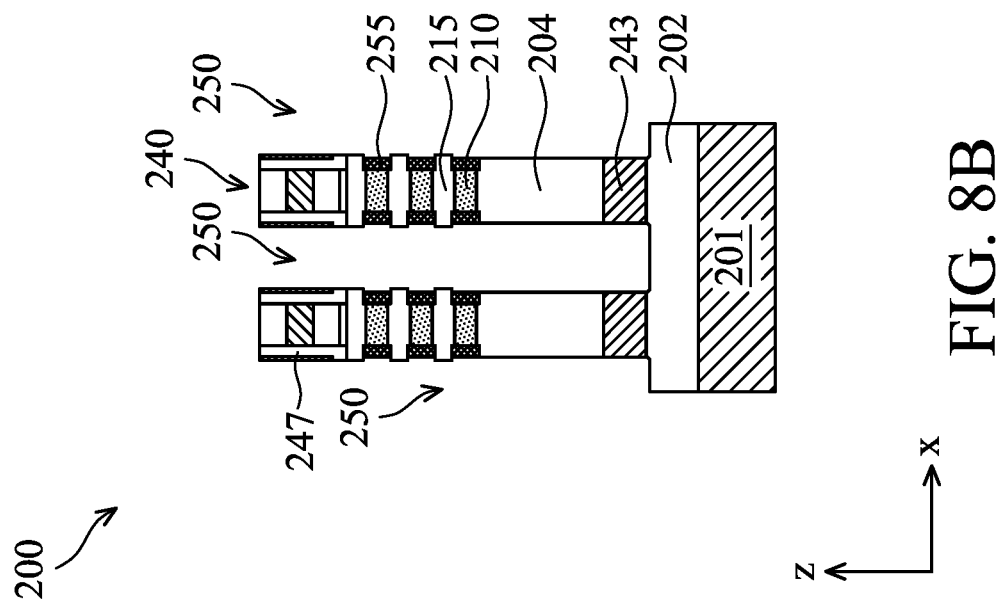
Figure 8A:
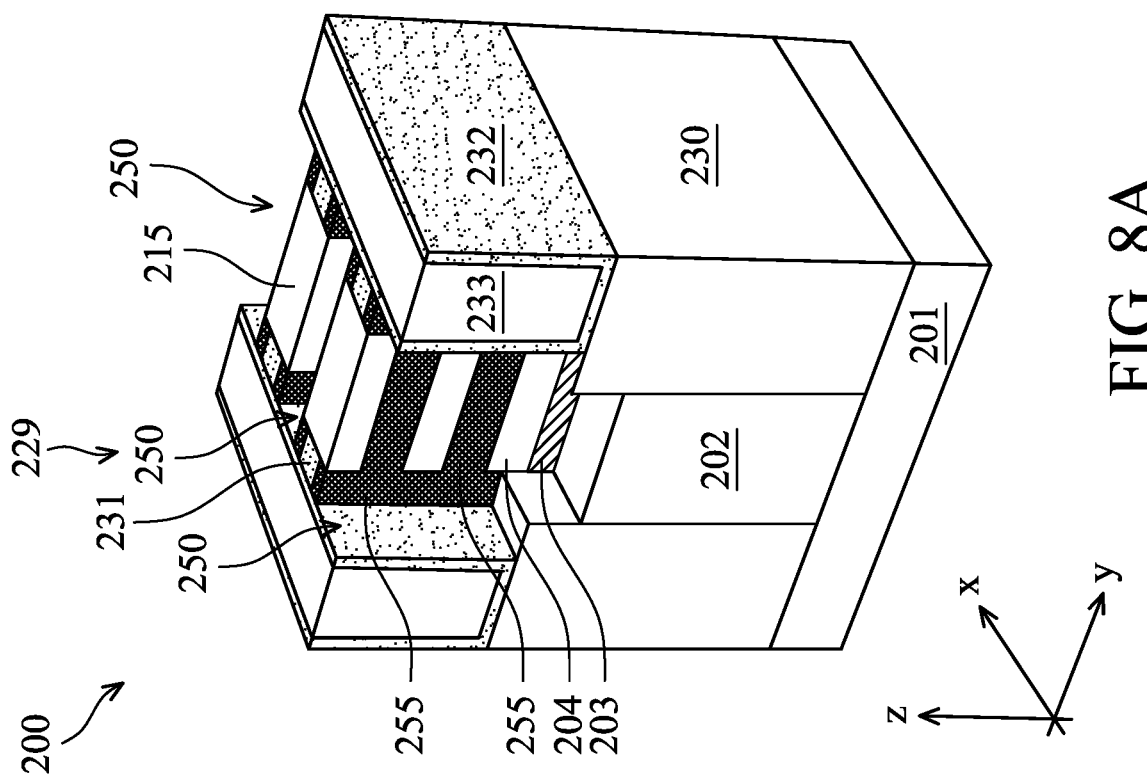

At operation 114, the method 100 (FIG. 1B) partially recesses the cladding layer 231 and the semiconductor layer 210 that are exposed in the S/D trenches 250 to form gaps and then forms inner spacers 255 in those gaps, such as shown in FIGS. 8A and 8B. For example, a first etching process is performed that selectively etches the cladding layer 231 and the semiconductor layers 210 exposed by S/D trenches 250 with minimal (to no) etching of the semiconductor layers 215, the isolating layer 204, the sacrificial layer 203, the base layer 202, the dielectric fins 229, and the isolation structure 230 such that gaps are formed between adjacent semiconductor layers 215 and between the bottommost semiconductor layers 215 and the isolating layer 204 under the gate spacers 247. Portions (edges) of the semiconductor layer 215 are thus suspended in the channel regions under gate spacers 247. In some embodiments, the gaps extend partially under dummy gate stacks 240. The first etching process is configured to laterally etch (e.g., along the "x" direction) the cladding layer 231 and the semiconductor layers 210, thereby reducing a length of the layers 231 and 210 along the "x" direction. The first etching process is a dry etching process, a wet etching process, other suitable etching process, or combinations thereof. For example, the first etching process may apply a fluorine-based dry etching process that is tuned selective to the materials in the layers 231 and 210. A deposition process then forms a spacer layer over gate structures 240 and over features defining S/D trenches 250, such as CVD, PVD, ALD, HDPCVD, MOCVD, RPCVD, PECVD, LPCVD, ALCVD, APCVD, other suitable methods, or combinations thereof.

The spacer layer partially (and, in some embodiments, completely) fills the S/D trenches 250. The deposition process is configured to ensure that the spacer layer fills the gaps between adjacent semiconductor layers 215 and between the bottommost semiconductor layer 215 and the isolating layer 204. A second etching process is then performed that selectively etches the spacer layer to form inner spacers 255 as depicted in FIGS. 8A and 8B with minimal (to no) etching of the semiconductor layers 215, the dummy gate stacks 240, the gate spacers 247, the isolating layer 204, the sacrificial layer 203, the base layer 202, the dielectric fins 229, and the isolation structure 230. In some embodiments, the spacer layer is removed from sidewalls of gate spacers 247 and sidewalls of the semiconductor layers 215. The spacer layer (and thus inner spacers 255) includes a material that is different than a material of the components 215, 247, 204, 203, 202, 229, and 230 to achieve desired etching selectivity during the second etching process. In some embodiments, the inner spacer 255 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacer 255 includes a low-k dielectric material, such as those described herein.

Figure 9B:
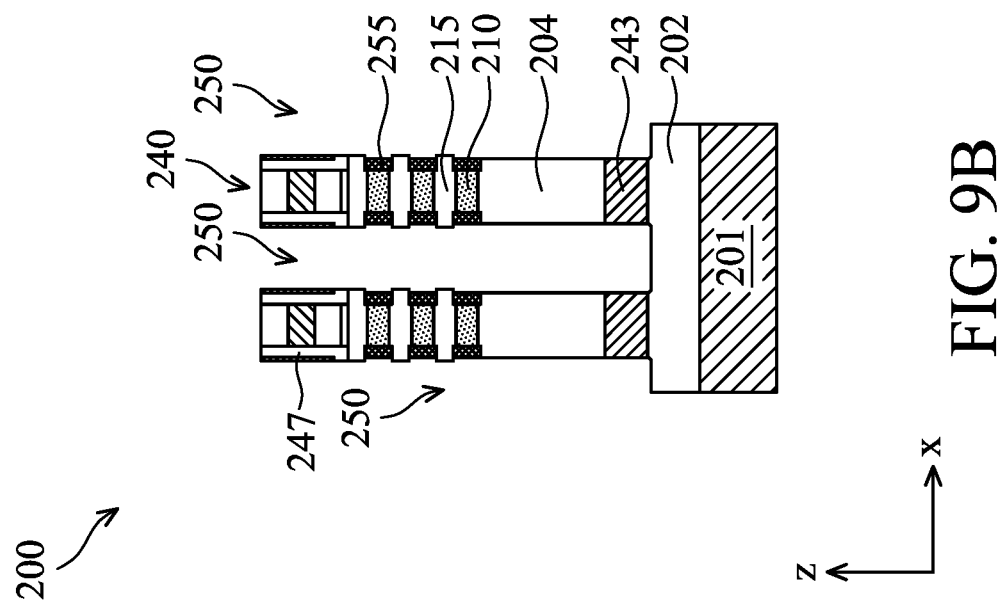
Figure 9A:
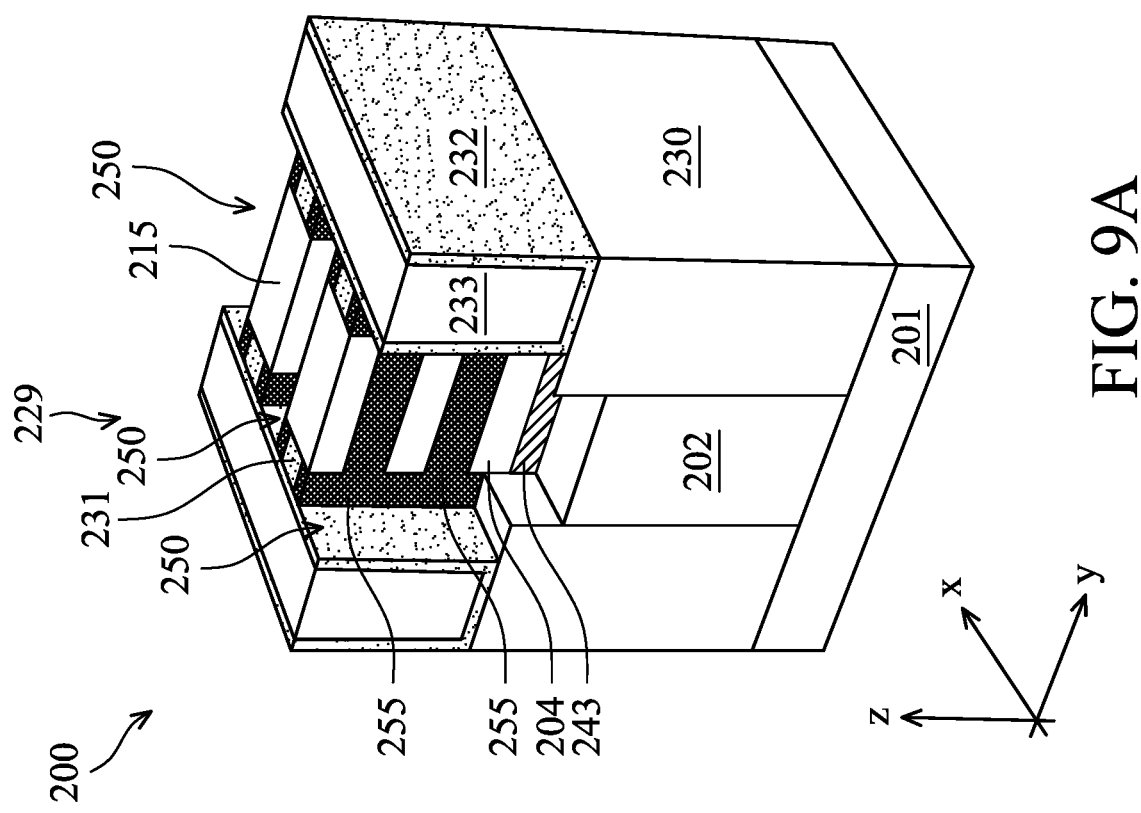

At operation 116, the method 100 (FIG. 1B) replaces the sacrificial layer 203 with a dielectric cap (or dielectric capping layer) 243, such as shown in FIGS. 9A and 9B. This may involve various etching and deposition processes. For example, a first etching process is performed that completely removes the sacrificial layer 203 that is disposed between two S/D trenches 250 with minimal (to no) etching of the various components exposed by the S/D trenches 250 including the gate spacers 247, the dummy gate stacks 240, the semiconductor layers 215, the isolating layer 204, the inner spacer 255, the base layer 202, the outer layers of the dielectric fins 229, and the isolation structure 230. After the first etching process finishes, a gap is formed between the isolating layer 204 and the base layer 202 and connecting the S/D trenches 250. The first etching process is a dry etching process, a wet etching process, other suitable etching process, or combinations thereof. In an embodiment, the sacrificial layer 203 includes silicon germanium with low germanium atomic percent (such as 5% to 15%), and the first etching process may apply a fluorine-based dry etching process that is tuned selective to the materials in the layer 203. In an embodiment, the layer 203 and the layers 231 and 210 all include silicon germanium but with different germanium atomic percent, the process of etching the layer 203 and the process of etching the layers 231 and 210 may both be fluorine-based plasma etching but with different etching parameters (such as etching gas species, flow rates, and/or other parameters) so that the etching processes are selective to the respective layers. After the layer 203 is removed, one or more dielectric materials are then deposited to fill the gap between the layers 204 and 202, using CVD, PVD, ALD, HDPCVD, MOCVD, RPCVD, PECVD, LPCVD, ALCVD, APCVD, other suitable methods, or combinations thereof. The deposition process is configured to ensure that the one or more dielectric materials fill the gap between the layers 204 and 202. A second etching process is then performed that selectively etches the one or more dielectric materials from the S/D trenches 250 with minimal (to no) etching of the components 255, 240, 247, 215, 229, 204, 202, and 230 that are exposed through the S/D trenches 250. The remaining portions of the one or more dielectric materials become the dielectric cap 243, as depicted in FIGS. 9A and 9B. The dielectric cap 243 includes a material that is different than a material of the components 255, 240, 247, 215, 229, 204, 202, and 230 that are exposed through the S/D trenches 250 to achieve desired etching selectivity during the second etching process. In some embodiments, the dielectric cap 243 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the dielectric cap 243 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material, or combinations thereof.

Figure 10B:
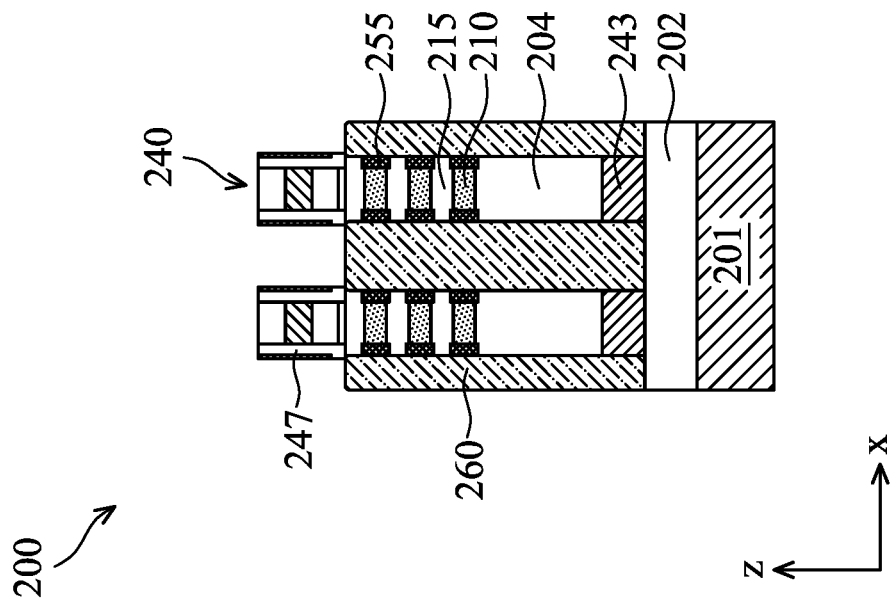
FIG. 10A illustrates a top view of a portion of a semiconductor device and FIG. 10B illustrates a cross-sectional view of the semiconductor device in FIG. 10A, in portion, along the B-B line of FIG. 10A, according to some embodiments.
Figure 10A:
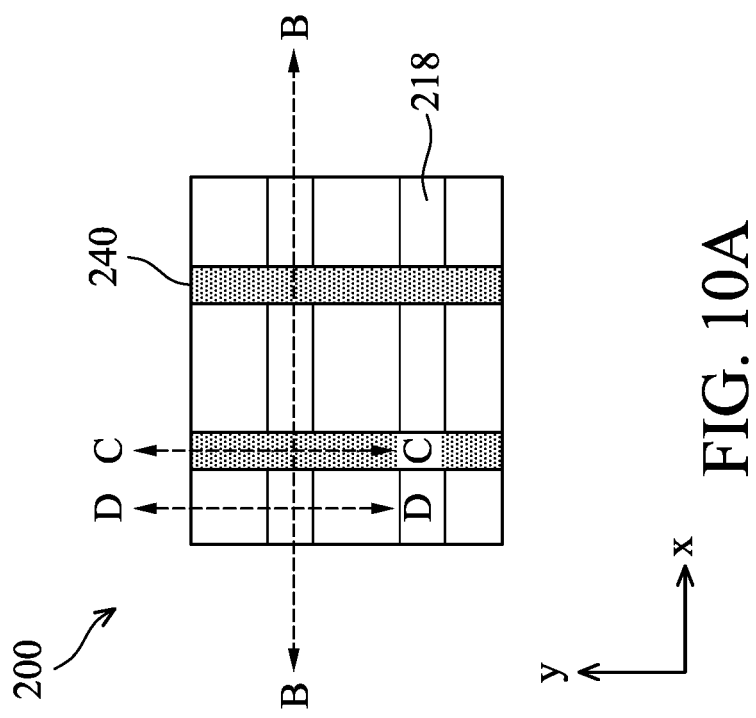
Figure 10D:
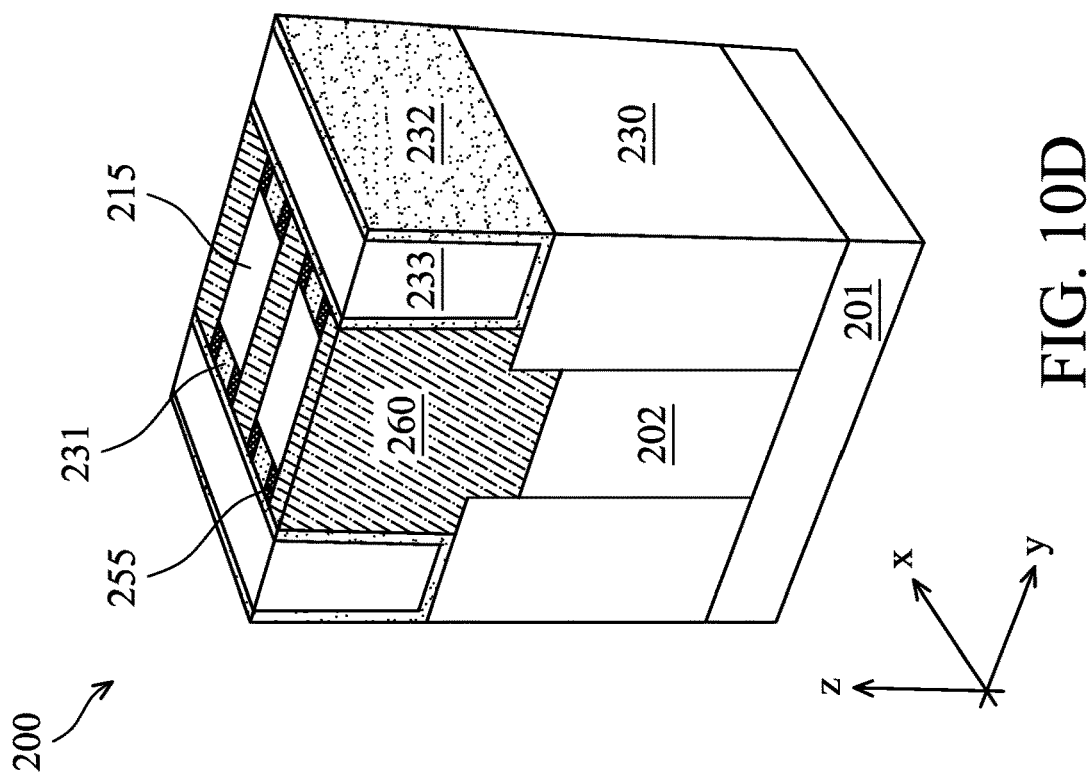
FIGS. 10C and 10D illustrate perspective views of the semiconductor device in FIG. 10A, in portion, with a front surface cut along the C-C line and D-D line of FIG. 10A, respectively, according to some embodiments.
Figure 10C:
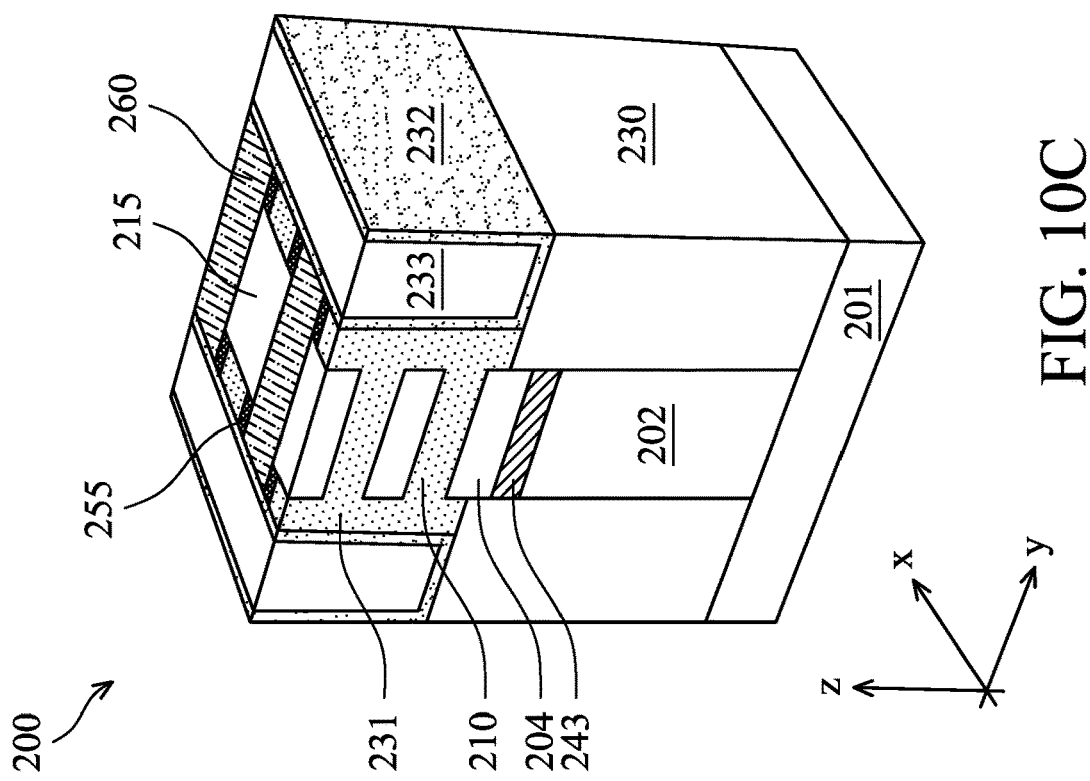

At operation 118, the method 100 (FIG. 1B) epitaxially grows semiconductor S/D features 260 in the S/D trenches 250. The resultant structure is shown in FIGS. 10A-10D according to an embodiment. FIG. 10A illustrates a top view of the device 200 and FIG. 10B illustrates a cross-sectional view of the device 200, in portion, along the B-B line in FIG. 10A. FIGS. 10C and 10D illustrate perspective views of the device 200, in portion, with their front surface cut along the C-C line (the gate region) and the D-D line (the S/D region) in FIG. 10A, respectively.

As shown in FIGS. 10B, 10C, and 10D, the epitaxial S/D features 260 are grown from the semiconductor layers 202 at the bottom of the S/D trenches 250 and from the semiconductor layers 215 at the sidewalls of the S/D trenches 250. In embodiments where the isolating layer 204 includes a semiconductor material, the epitaxial S/D features 260 are grown from the isolating layer 204 as well. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 202 and 215 (in particular, semiconductor layers 215) and optionally the layer 204. Epitaxial S/D features 260 are doped with n-type dopants or p-type dopants for n-type transistors or p-type transistors respectively. In some embodiments, for n-type transistors, epitaxial S/D features 260 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 260 include silicon germanium or germanium and can be doped with boron, other p-type dopant, or combinations thereof (for example, forming Si:Ge:B epitaxial source/drain features). In some embodiments, epitaxial S/D features 260 include more than one epitaxial semiconductor layer, where the epitaxial semiconductor layers can include the same or different materials and/or dopant concentrations. In some embodiments, epitaxial S/D features 260 include materials and/or dopants that achieve desired tensile stress and/or compressive stress in respective channel regions. In some embodiments, epitaxial source/drain features 260 are doped during deposition by adding impurities to a source material of the epitaxy process (i.e., in-situ). In some embodiments, epitaxial source/drain features 260 are doped by an ion implantation process subsequent to a deposition process. In some embodiments, annealing processes (e.g., rapid thermal annealing (RTA) and/or laser annealing) are performed to activate dopants in epitaxial source/drain features 260. In some embodiments, epitaxial source/drain features 260 are formed in separate processing sequences that include, for example, masking p-type GAA transistor regions when forming epitaxial source/drain features 260 in n-type GAA transistor regions and masking n-type GAA transistor regions when forming epitaxial source/drain features 260 in p-type GAA transistor regions. Further, in the present embodiment as shown in FIGS. 10C and 10D, the S/D features 260 are formed into bar-like shapes and fully fill the S/D trenches 250 to increase the volume of the S/D features 260 and to reduce S/D resistance thereof. After the S/D features 260 are formed, the operation 118 may deposit a contact etch stop layer (CESL) (not shown) over surfaces of the S/D features 260 and the gate spacers 247 and deposit an inter-layer dielectric (ILD) layer (not shown) over the CESL, the gate spacers 247, and the dummy gate stacks 240. The CESL may include silicon nitride and the ILD layer may include silicon oxide in an embodiment. Then, the operation 118 may perform a CMP process to planarize the CESL and the ILD layer and to expose the top layer of the dummy gate stacks 240, making them ready for a gate replacement process as discussed in operation 120.

Figure 11:
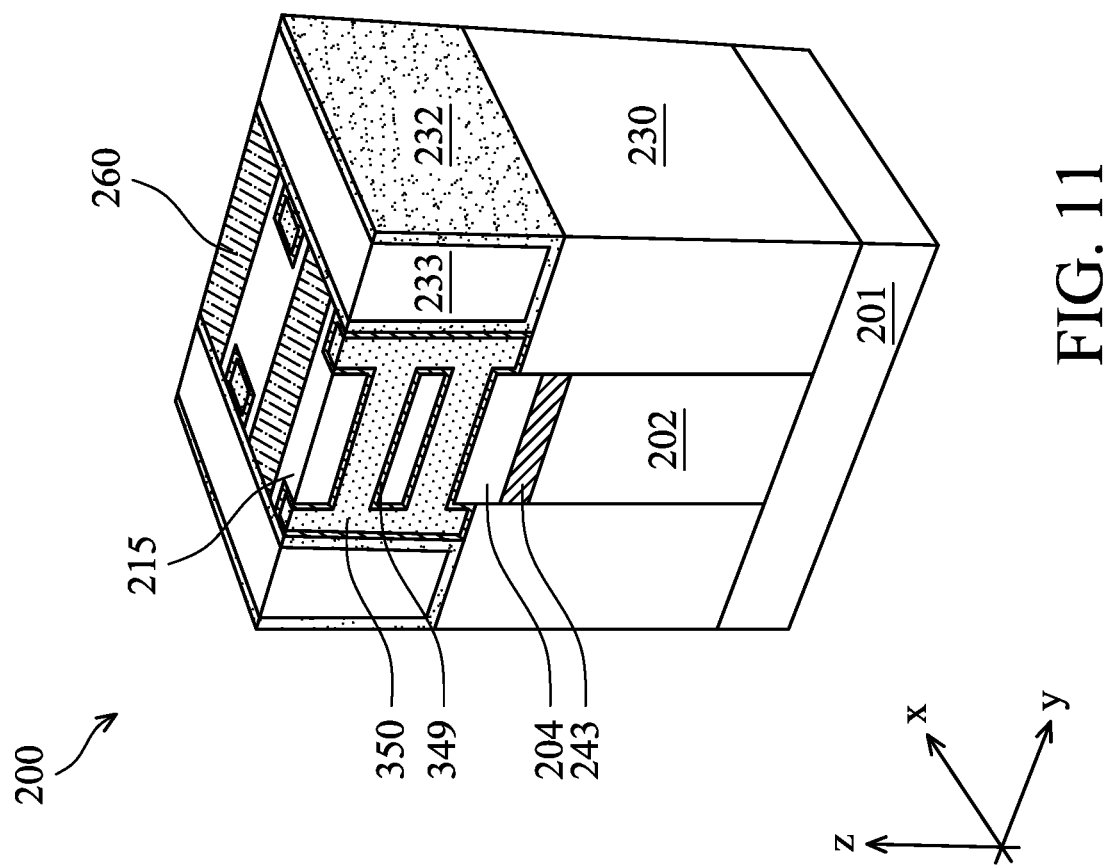
FIG. 11 illustrates a perspective view of a semiconductor device, in portion, with a front surface cut along the C-C line of FIG. 10A, respectively, according to some embodiments.
Figure 12B:
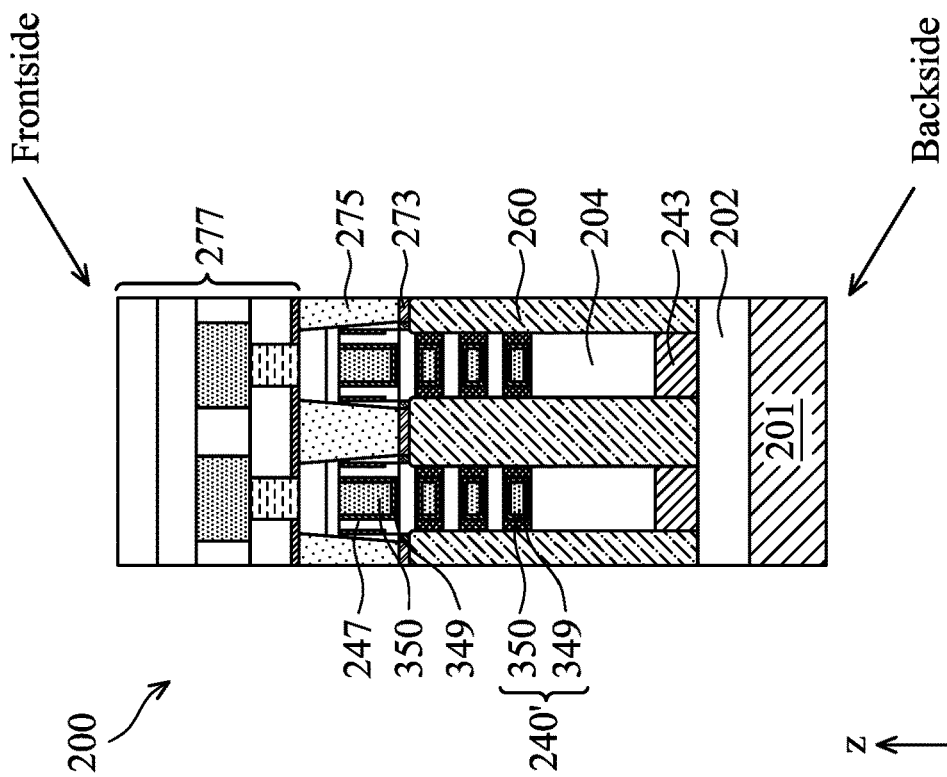
FIGS. 12A and 13A illustrate top views of a portion of a semiconductor device and FIGS. 12B and 13B illustrate cross-sectional views of the semiconductor device in FIGS. 12A and 13A, in portion, along the B-B line of FIGS. 12A and 13A respectively, according to some embodiments.

At operation 120, the method 100 (FIG. 1B) replaces the dummy gate stacks 240 with functional gate stack 240' (such as high-k metal gates). The resultant structure is shown in FIG. 11 according to an embodiment. Further illustration of the functional gate stack 240' is shown in FIG. 12B. This involves a variety of processes as briefly described below.

First, the operation 120 removes the dummy gate stacks 240 (the dummy gate electrodes 245 and the dummy gate dielectric layer 235, see FIG. 6B) using one or more etching process. This forms a gate trench between the S/D features 260. The etching process may be a dry etching process, a wet etching process, other suitable etching process, or combinations thereof. In some embodiments, the etching process is a multi-step etch process. For example, the etching process may alternate etchants to separately remove various layers of the dummy gate stacks 240. In some embodiments, the etching process is configured to selectively etch the dummy gate stacks 240 with minimal (to no) etching of other features of the device 200, such as the ILD layer, the gate spacers 247, the isolation structure 230, the semiconductor layers 215, the cladding layer 231, the semiconductor layers 210, and the isolating layer 204.

Next, the operation 120 removes the cladding layer 231 and the semiconductor layers 210 exposed in the gate trench, leaving the semiconductor layers 215 suspended over the isolating layer 204 and connecting the S/D features 260. This process is also referred to as a channel release process and the semiconductor layers 215 are also referred to as channel layers. The etching process selectively etches the cladding layer 231 and the semiconductor layers 210 with minimal (to no) etching of the semiconductor layers 215, the isolating layer 204, the gate spacers 247, the inner spacers 255, the isolation structure 230, and the outer layers of the dielectric fins 229. It is noted that the dielectric cap 243, when existing, is protected by the isolating layer 204 and the isolation structure 230 from this etching process.

Next, the operation 120 forms a gate dielectric layer 349 that wraps around each of the semiconductor layers 215 and forms a gate electrode 350 over the gate dielectric layer 349. The functional gate stack 240' comprises the gate dielectric layer 349 and the gate electrode 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. The gate dielectric layer 349 may be formed by chemical oxidation, thermal oxidation, atomic layer deposition (ALD), chemical vapor deposition (CVD), and/or other suitable methods. In some embodiments, the gate stack 240' further includes an interfacial layer between the gate dielectric layer 349 and the channel layers 215. The interfacial layer may include silicon dioxide, silicon oxynitride, or other suitable materials. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240' includes a high-k dielectric layer and metal layer(s), it is also referred to as a high-k metal gate.

Figure 12A:
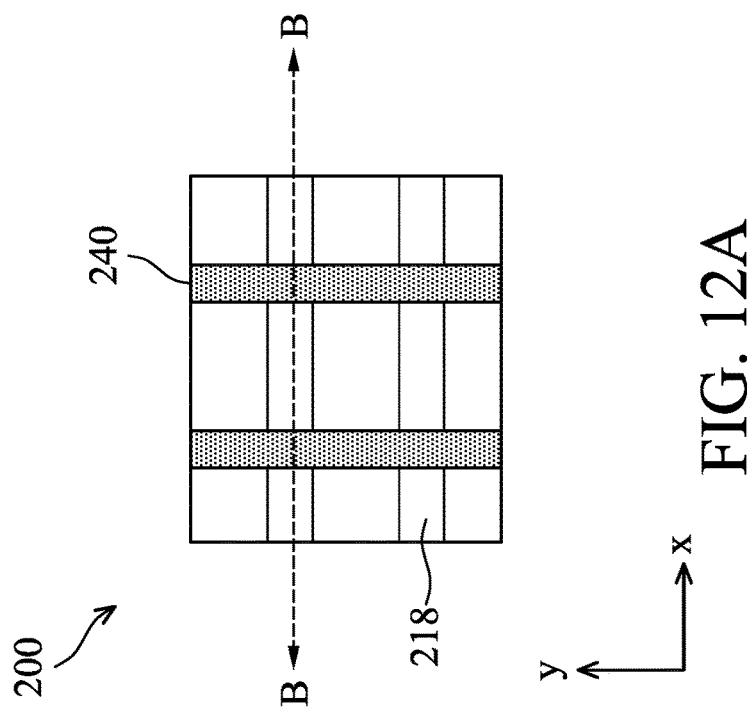

At operation 122, the method 100 (FIG. 1B) performs mid-end-of-line (MEOL) and back-end-of-line (BEOL) processes. The resultant structure is shown in FIGS. 12A-12B according to an embodiment. For example, the operation 122 etches S/D contact holes to expose some of the S/D features 260. The S/D features 260 may be partially etched in some embodiments. The etching processes can be dry etching, wet etching, reactive ion etching, or other etching methods. Then, the operation 122 forms silicide features 273 over the S/D features 260 and form S/D contacts (or vias) 275 over the silicide features 273. Since the silicide features 273 and the S/D contacts 275 are formed at the frontside of the device 200, they are also referred to as frontside silicide features 273 and frontside S/D contacts 275 respectively.

The silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 275.

The operation 122 may also form gate vias connecting to the gate stacks 240', form S/D contact vias connecting to the S/D contacts 275, and form one or more interconnect layers with wires and vias embedded in dielectric layers. The one or more interconnect layers connecting gate, source, and drain electrodes of various transistors, as well as other circuits in the device 200, to form an integrated circuit in part or in whole. The operation 122 may also form passivation layer(s) over the interconnect layers. In the example shown in FIG. 12B, a layer 277 is used to denote various dielectric and metal layers including interconnect layers and passivation layers formed at the frontside of the device 200 over the S/D contacts 275.

Figure 13B:
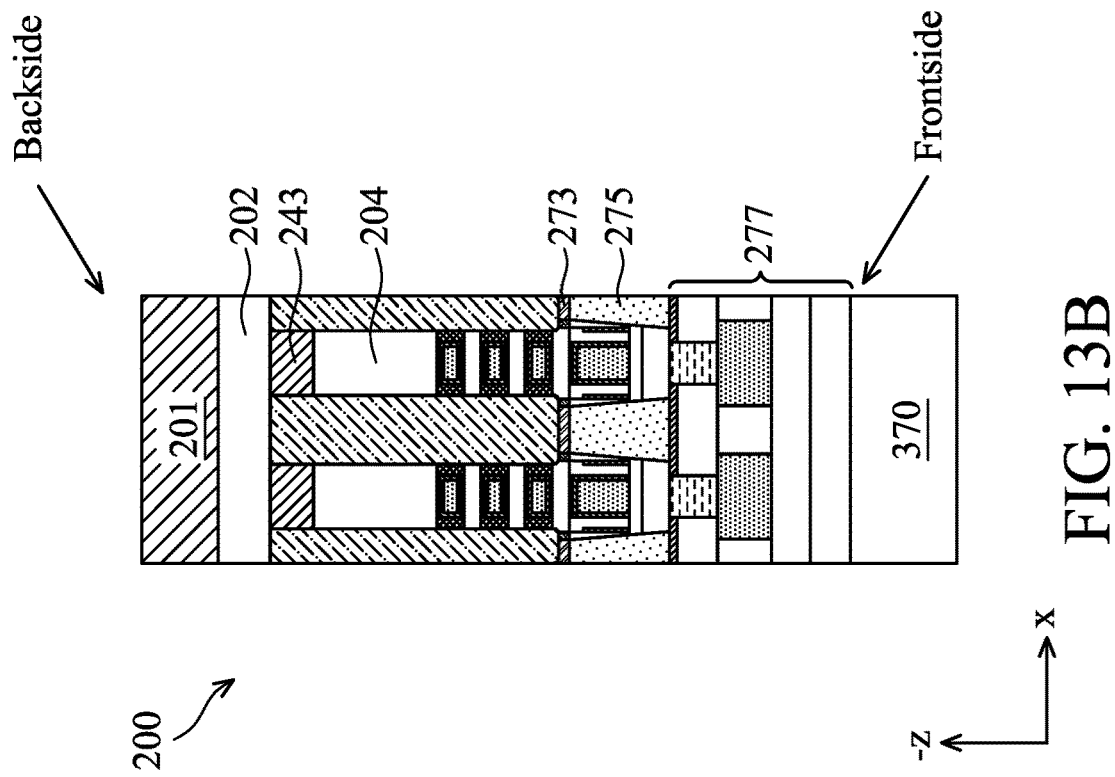
Figure 13A:
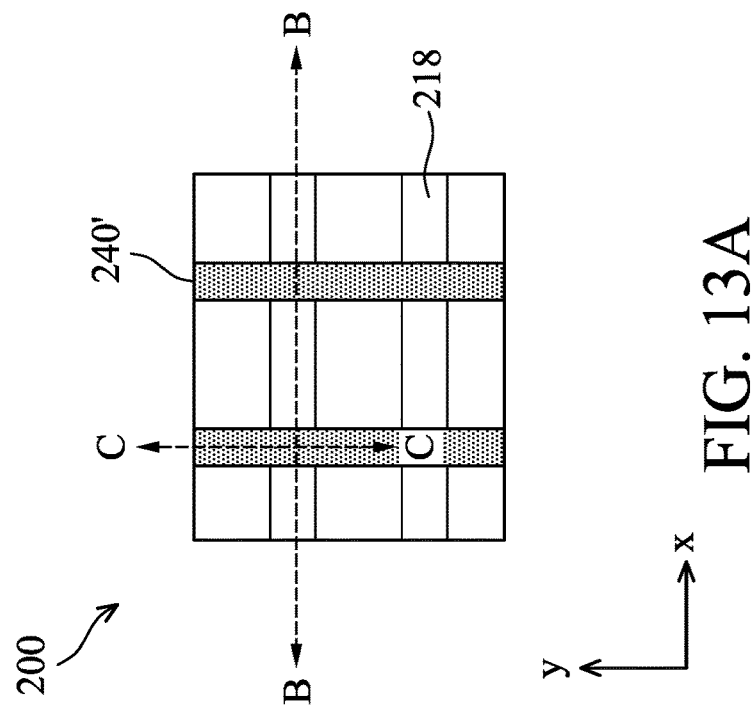

At operation 124, the method 100 (FIG. 1C) flips the device 200 upside down and attaches the frontside of the device 200 to a carrier 370, such as shown in FIG. 13B. FIG. 13A illustrates a top view of the device 200, and FIG. 13B illustrates a cross-sectional view of the device 200, in portion, along the B-B line in FIG. 13A. In FIG. 13B, the "–z" direction points from the frontside of the device 200 to the backside of the device 200. The device 200 is now accessible from its backside for further processing. The operation 124 may use any suitable attaching processes, such as direct bonding, hybrid bonding, using adhesive, or other bonding methods. The operation 124 may further include alignment, annealing, and/or other processes. The carrier 370 may be a silicon wafer in some embodiment.

Figure 15A:
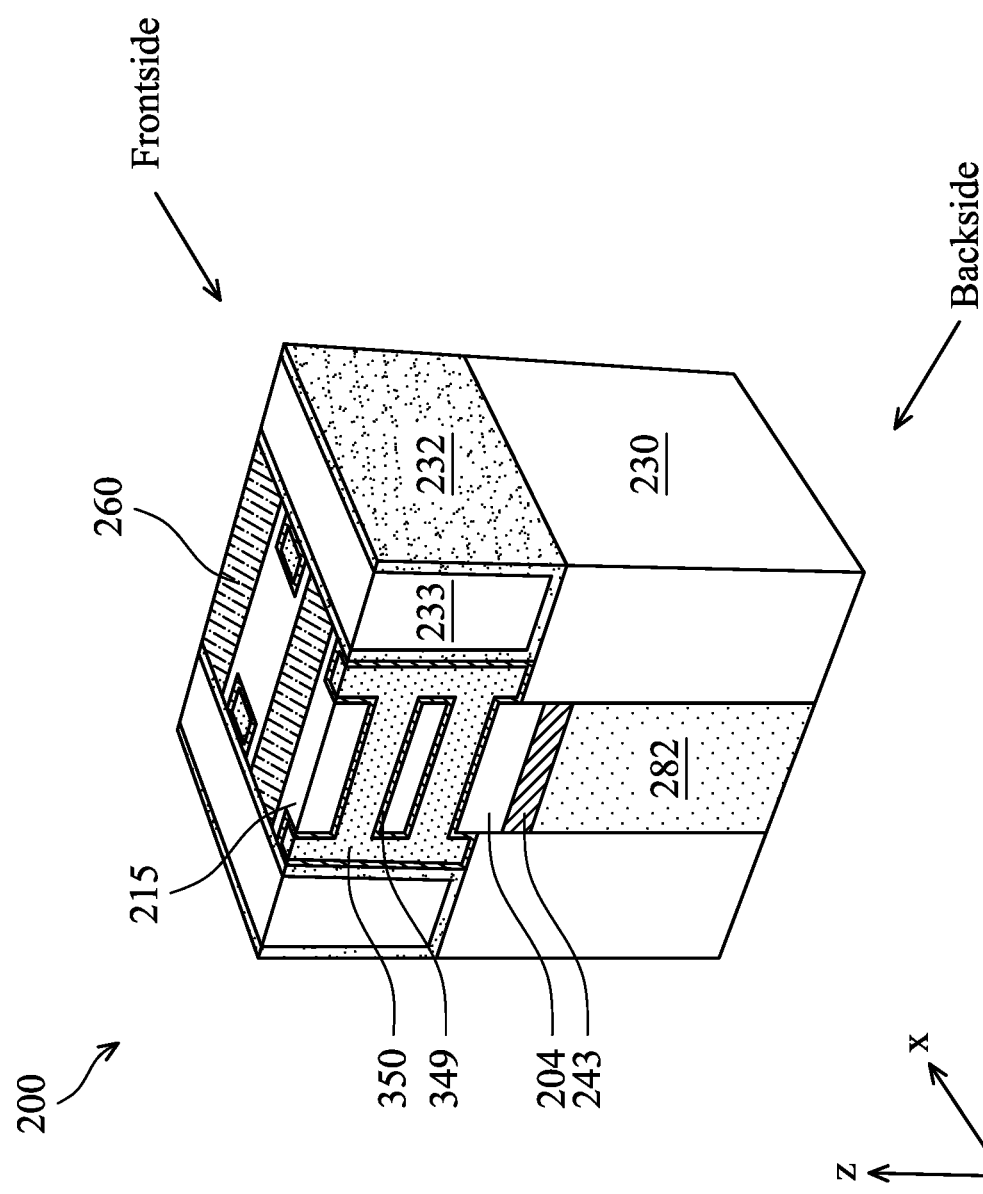

At operation 126, the method 100 (FIG. 1B) forms backside vias 282 connecting to the source/drain features 260, such as shown in FIGS. 15A and 15B. FIG. 15A illustrates a perspective view of the device 200, in portion, with its front surface (in the y-z plane) cut along the C-C line in FIG. 13A. FIG. 15B shows a cut-out of the structure of FIG. 15A along the B-B line of FIG. 13A. In the depicted embodiment, one of the S/D features 260 is electrically connected to the backside via 282 while the other, adjacent, S/D feature 260 is covered by a dielectric liner 274 and a dielectric layer 276. In some embodiments, a silicide feature (not shown) is disposed between the S/D feature 260 and the backside via 282. The operation 126 may involve a variety of processes, as discussed below according to an embodiment.

In an embodiment, the operation 126 may first thin down the substrate 201 from the backside of the device 200 until the base layer 202 and the isolation structure 230 are exposed from the backside of the device 200. This is illustrated in FIG. 14A. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

After thinning down the substrate 201, the operation 126 may form an etch mask that includes a hard mask 237 (for example, silicon nitride) and a patterned resist 241 (which may include multiple layers itself). The etch mask covers the areas on the backside of the S/D features 260 that are to be connected to backside vias 282 and exposes the areas on the backside of the S/D features 260 that are not to be connected to backside vias 282, such as shown in FIG. 14B.

Figure 14C:
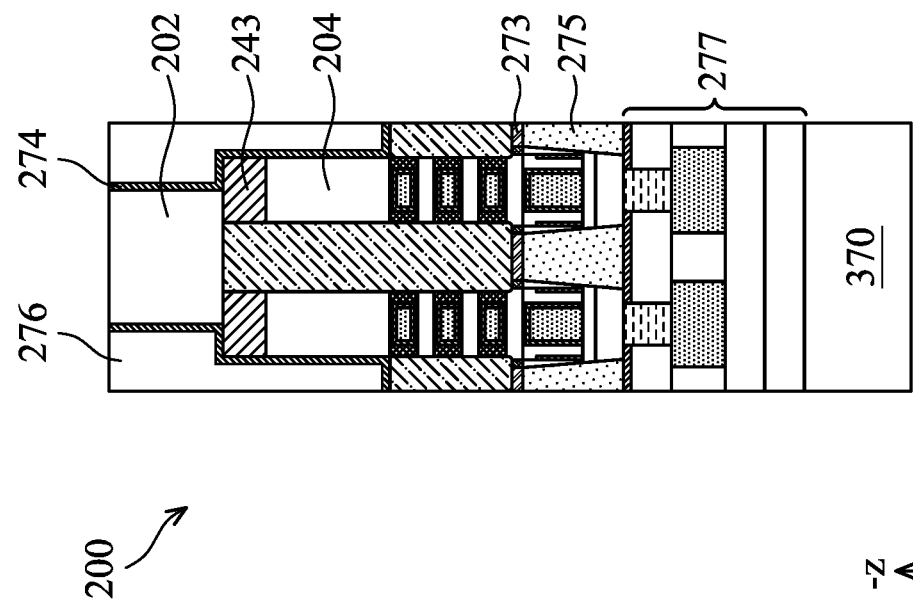

Then, the operation 126 etches the base layer 202 and the S/D features 260 through the etch mask to form trenches 272, such as shown in FIG. 14C. For example, the operation 126 may apply an etching process that is tuned to be selective to the materials of the base layer 202 and with no (or minimal) etching to the dielectric cap 243 if present, the isolating layer 204 (if the dielectric cap 243 is not present), and the isolation structure 230. The thickness h3' of the dielectric cap 243 may be substantially equal to the thickness h3 of the sacrificial layer 203 (FIG. 2B). In some embodiments, the dielectric cap 243 may be partially etched and its thickness h3' becomes smaller than the thickness h3 of the sacrificial layer 203 (FIG. 2B). The etching process can be dry etching, wet etching, reactive ion etching, or other etching methods. The etching process may partially etch the S/D features 260. The gate stacks 240' are protected by the isolating layer 204 or by the isolating layer 204 and the dielectric cap 243 from this etching process.

Figure 14D:
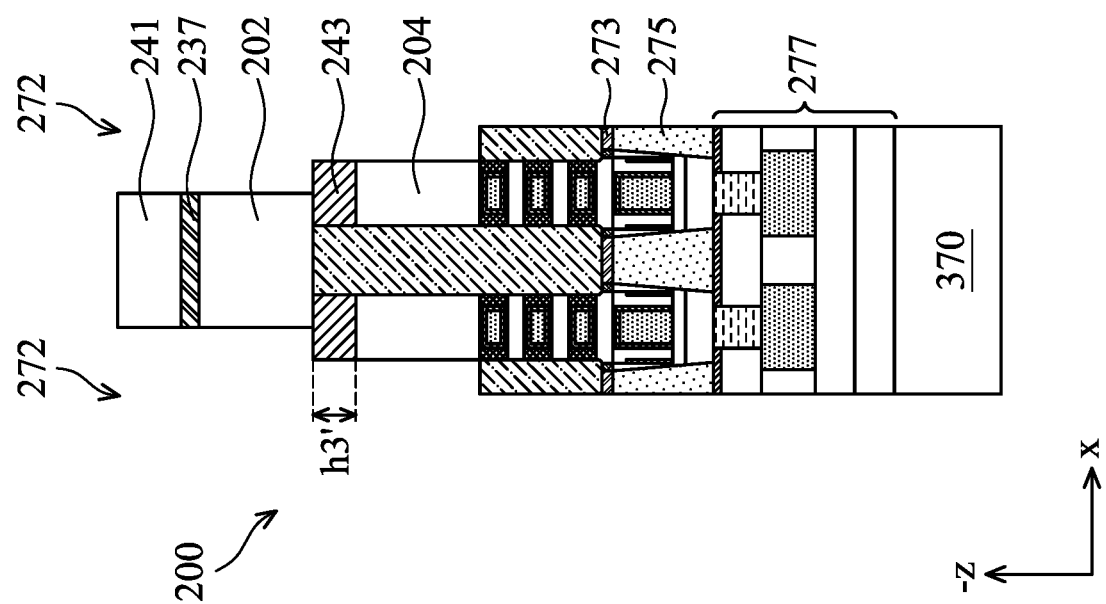

Then, the operation 126 removes the patterned resist 241 and forms the dielectric liner 274 and the dielectric layer 276 to fill the trenches 272, such as shown in FIG. 14D. In some embodiments, the dielectric liner 274 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. In some embodiments, the dielectric layer(s) 276 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer(s) 276 may be formed by PECVD (plasma enhanced CVD), FCVD (flowable CVD), or other suitable methods. The operation 126 may perform a CMP process to planarize the layers 274 and 276 and to remove the hard mask 237.

Figure 14E:
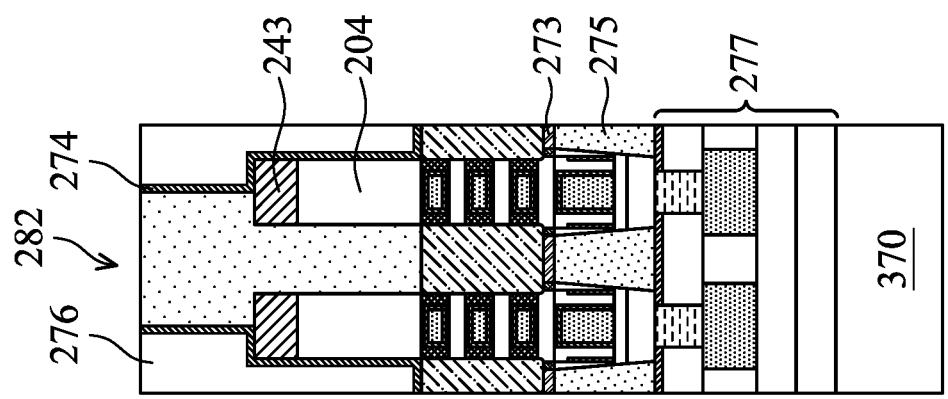

Then, the operation 126 etches the base layer 202 to form via holes (or contact holes) 280 that expose the backside of the S/D features 260, such as shown in FIG. 14E. In some embodiments, the etching process is tuned selective to the base layer 202 with no (or minimal) etching to the materials of the layers 276 and 274, the dielectric cap 243 (if present), the isolating layer 204 (if the dielectric cap 243 is not present), and the isolation structure 230. So, the thickness h3' of the dielectric cap 243 may be substantially equal to the thickness h3 of the sacrificial layer 203 (FIG. 2B). In some embodiments, the dielectric cap 243 may be partially etched and its thickness h3' becomes smaller than the thickness h3 of the sacrificial layer 203 (FIG. 2B).

Figure 14F:
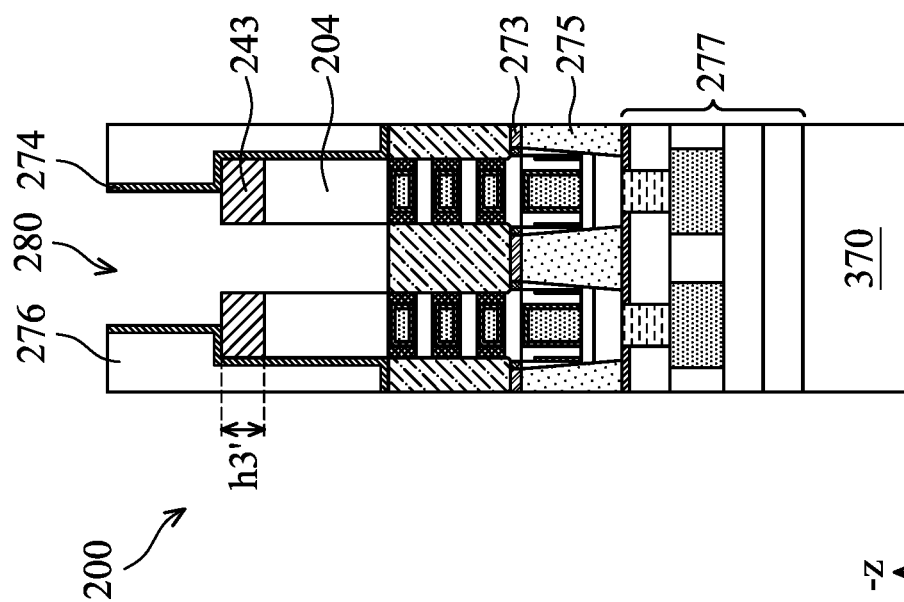

Subsequently, the operation 126 forms an optional silicide feature and the backside vias 282 in the via holes 280, such as shown in FIG. 14F. The silicide feature may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the via 282 may include a barrier layer 281 and a metal fill layer 283 over the barrier layer 281 (see FIG. 15B). The barrier layer 281 may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer 283 may include tungsten (W), cobalt (Co), molybdenum (Mo), ruthenium (Ru), aluminum (Al), or other metals, and may be formed by CVD, PVD, ALD, plating, or other suitable processes. The barrier layer 281 may be omitted in some embodiments.

As illustrated in FIG. 15B, the metal gate stack 240' (including the gate electrode 350, the gate dielectric 349, and the optional interfacial layer 348) is sufficiently isolated from the backside via 282 by the isolating layer 204 and the dielectric cap 243 (if present). The vertical distance h4 between the bottom surface of the metal gate stack 240' and the top surface of the backside via 282 is designed to be large enough for a TDDB performance objective of the device 200. In the present embodiment, h4 equals to the sum of h3' and h2. The distance h2 has been discussed above with reference to FIG. 3. For example, the distance h2 is controlled to be in a range of about 8 nm to about 20 nm in some embodiments for improving TDDB performance yet still maintaining good performance in the backside via 282. If the distance h2 is too small (such as less than 8 nm), the TDDB performance of the device 200 might suffer in some instances. For example, the metal elements from the metal gates 240' and the backside vias 282 might migrate through the layers 230, 243, and/or 204 and to cause short circuit failures over time. However, if the distance h2 is too large (such as greater than 20 nm), the backside vias 282 might be long and narrow in some instances (see FIG. 15B on the left, a portion of the via 282 extending through the layers 243 and 204), which would increase the S/D contact resistance. In some embodiments where the distance h2 is designed to be large enough for TDDB performance, the dielectric cap 243 (as well as the sacrificial layer 203, see FIGS. 2B and 2C) may be omitted. The design of the thickness h1 of the isolating layer 204 has been discussed above with reference to FIGS. 2B and 3.

Figure 16:
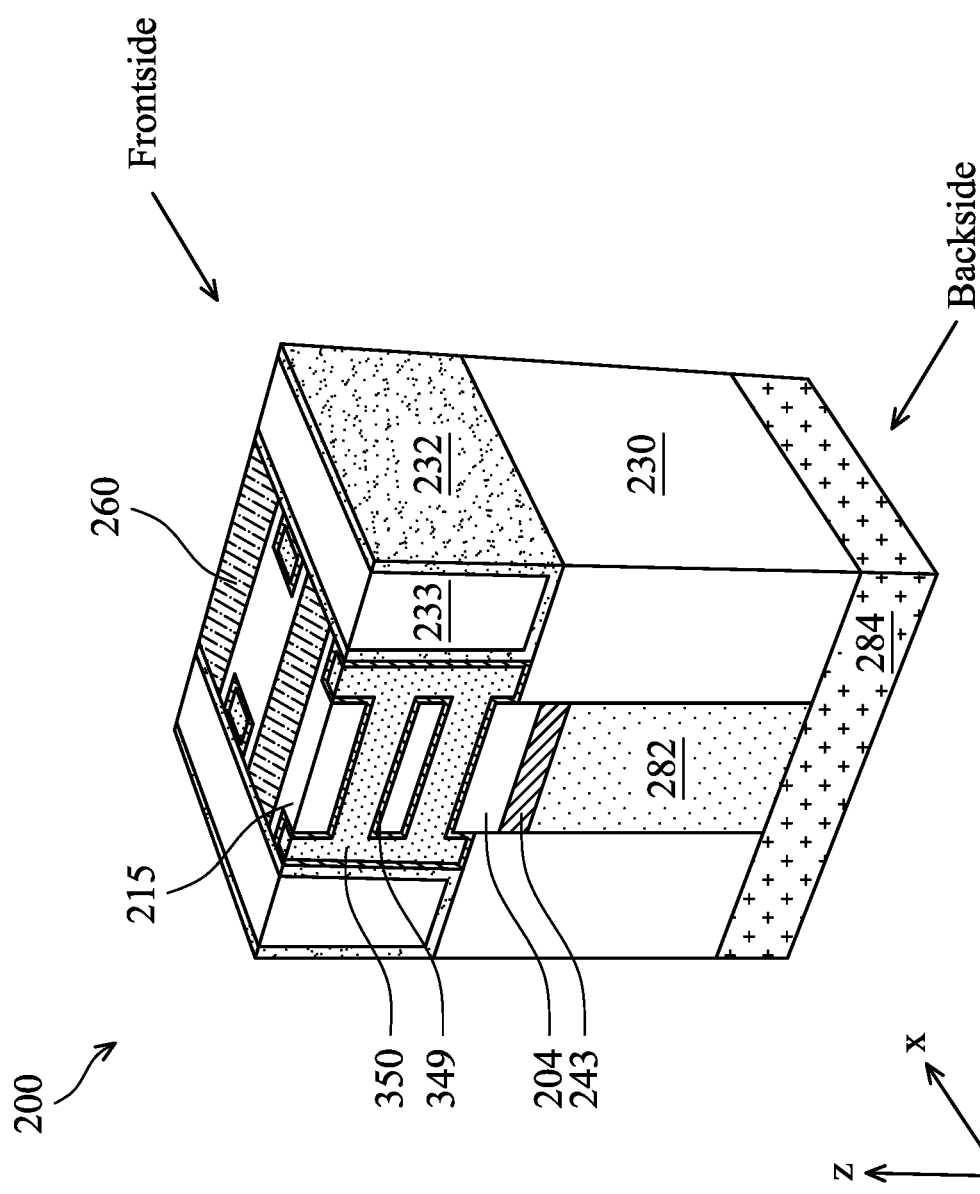
FIG. 16 illustrates a perspective view of a semiconductor device, in portion, with a front surface cut along the C-C line of FIG. 13A, respectively, according to some embodiments.

At operation 128, the method 100 (FIG. 1B) performs further fabrications to the device 200. For example, the operation 128 forms backside power rails 284 as shown in FIG. 16. As illustrated in FIG. 16, the backside via 282 is electrically connected to the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), aluminum (Al), titanium (Ti), tantalum (Ta), or other metals, and may be deposited by CVD, PVD, ALD, plating, or other suitable processes. Although not shown in FIG. 16, the backside power rails 284 are embedded in one or more dielectric layers. The operation 128 may further form backside interconnect structures (not shown) under the power rails 284, and the backside interconnect structure include wires and vias embedded in one or more dielectric layers. In some embodiment, the backside power rails 284 are considered part of the backside interconnect structures. Having backside power rails 284 beneficially increases the number of metal tracks available in the device 200 for directly connecting to source/drain features and metal gate stacks. It also increases the gate density for greater device integration than other structures without the backside power rails 284. The backside power rails 284 may have wider dimension than the first level metal (M0) tracks on the frontside of the device 200, which beneficially reduces the backside power rail resistance.

Although not intended to be limiting, embodiments of the present disclosure provide one or more of the following advantages. For example, embodiments of the present disclosure provide backside power rails and backside vias to further increase the device integration density and to further reduce power drop and power consumptions associated with power rails. Embodiments of the present disclosure provide excellent isolation between metal gates and backside vias to improve TDDB performance. Embodiments of the present disclosure can be readily integrated into existing semiconductor manufacturing processes.

In one example aspect, the present disclosure is directed to a method that includes forming a fin structure over a substrate, wherein the fin structure includes a base layer, an isolating layer over the base layer, and a stack of channel layers and first sacrificial layers alternately stacked over the isolating layer. The method further includes forming an isolation structure adjacent to sidewalls of the fin structure, wherein a top surface of the isolation structure is above a bottom surface of the isolating layer and below a top surface of the isolating layer. The method further includes depositing a second sacrificial layer over the isolation structure and over the sidewalls of the fin structure; etching the second sacrificial layer and the fin structure to form two source/drain trenches, wherein the source/drain trenches expose the base layer; partially removing the first and the second sacrificial layers through the source/drain trenches to form gaps; and depositing a dielectric spacer in the gaps.

In some embodiment, after the depositing of the dielectric spacer, the method further includes epitaxially growing source/drain features in the source/drain trenches. In an embodiment of the method, the isolating layer includes silicon or a dielectric material. In another embodiment of the method, the isolating layer has a thickness in a range of about 8 nm to about 40 nm. In an embodiment, the top surface of the isolation structure is above the bottom surface of the isolating layer by a distance in a range of about 8 nm to about 20 nm.

In another embodiment, the fin structure further includes a third sacrificial layer between the base layer and the isolating layer. The third sacrificial layer includes a different material than the base layer, the isolating layer, the channel layers, the first sacrificial layers, and the second sacrificial layer. In a further embodiment, the etching of the second sacrificial layer and the fin structure results in a portion of the third sacrificial layer interposed between the source/drain trenches, and the method further includes removing the portion of the third sacrificial layer with a first plasma etching process, resulting in space vertically between the base layer and the isolating layer; and depositing a dielectric material filling the space. In another further embodiment, the partially removing of the first and the second sacrificial layers includes applying a plasma etching process that is tuned to etch the first and the second sacrificial layers but not the third sacrificial layer. In yet another further embodiment, each of the first, second, and third sacrificial layers includes silicon germanium, and the third sacrificial layer includes germanium at a lower atomic percent than the first and the second sacrificial layers.

In another example aspect, the present disclosure is directed to a method that includes forming a fin structure over a substrate, wherein the fin structure includes a base layer, a first sacrificial layer over the base layer, an isolating layer over the first sacrificial layer, and a stack of channel layers and second sacrificial layers alternately stacked over the isolating layer, wherein the first sacrificial layer includes a different material than the base layer, the isolating layer, the channel layers, and the second sacrificial layers. The method further includes forming an isolation structure adjacent to sidewalls of the fin structure, wherein a top surface of the isolation structure is above a top surface of the first sacrificial layer and below a top surface of the isolating layer; and depositing a third sacrificial layer over the isolation structure and over the sidewalls of the fin structure, wherein the third sacrificial layer includes a different material than the first sacrificial layer. The method further includes etching the third sacrificial layer and the fin structure to form two source/drain trenches, wherein the source/drain trenches expose the base layer, and a portion of the first sacrificial layer is interposed between the source/drain trenches. The method further includes replacing the portion of the first sacrificial layer with a dielectric cap.

In an embodiment, before the replacing, the method further includes partially removing the second and the third sacrificial layers through the source/drain trenches to form gaps and depositing a dielectric spacer in the gaps. In a further embodiment, the replacing includes removing the first sacrificial layer with a first plasma etching process, resulting in space vertically between the base layer and the isolating layer and depositing a dielectric material filling the space. In a further embodiment, the partially removing the second and the third sacrificial layers includes applying a second plasma etching process that is tuned to etch the second and the third sacrificial layers but not the first sacrificial layer. In a further embodiment, both the first and the second plasma etching processes apply a fluorine-based plasma.

In another embodiment of the method, the isolating layer includes silicon or a dielectric material. In yet another embodiment, after the replacing, the method further includes epitaxially growing source/drain features in the source/drain trenches and forming a contact structure connecting to the source/drain features, wherein a portion of the contact structure is disposed below the isolating layer.

In yet another example aspect, the present disclosure is directed to a semiconductor structure that includes a source/drain feature; channel layers connecting to the source/drain feature; a gate structure adjacent to the source/drain feature and engaging each of the channel layers; an isolating layer directly below the channel layers; a contact structure connecting to the source/drain feature, wherein a portion of the contact structure is directly below the isolating layer; and an isolation structure adjacent to the contact structure and below the gate structure, wherein a top surface of the isolation structure is below a top surface of the isolating layer and above a bottom surface of the isolating layer.

In an embodiment of the semiconductor structure, the isolating layer includes silicon or a dielectric material. In another embodiment, the isolating layer has a thickness in a range of about 8 nm to about 40 nm. In yet another embodiment, the semiconductor structure further includes a dielectric cap between the isolating layer and the contact structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin structure over a substrate, wherein the fin structure includes a base layer, an isolating layer over the base layer, and a stack of channel layers and first sacrificial layers alternately stacked over the isolating layer;
   forming an isolation structure adjacent to sidewalls of the fin structure, wherein a top surface of the isolation structure is above a bottom surface of the isolating layer and below a top surface of the isolating layer;
   depositing a second sacrificial layer over the isolation structure and over the sidewalls of the fin structure;
   etching the second sacrificial layer and the fin structure to form two source/drain trenches, wherein the source/drain trenches expose the base layer;
   partially removing the first and the second sacrificial layers through the source/drain trenches to form gaps; and
   depositing a dielectric spacer in the gaps.

2. The method of claim 1, after the depositing of the dielectric spacer, further comprising:
   epitaxially growing source/drain features in the source/drain trenches.

3. The method of claim 1, wherein the isolating layer includes silicon or a dielectric material.

4. The method of claim 1, wherein the isolating layer has a thickness in a range of about 8 nm to about 40 nm.

5. The method of claim 1, wherein the top surface of the isolation structure is above the bottom surface of the isolating layer by a distance in a range of about 8 nm to about 20 nm.

6. The method of claim 1, wherein the fin structure further includes a third sacrificial layer between the base layer and the isolating layer, wherein the third sacrificial layer includes a different material than the base layer, the isolating layer, the channel layers, the first sacrificial layers, and the second sacrificial layer.

7. The method of claim 6, wherein the etching of the second sacrificial layer and the fin structure results in a portion of the third sacrificial layer interposed between the source/drain trenches, further comprising:
   removing the portion of the third sacrificial layer with a first plasma etching process, resulting in space vertically between the base layer and the isolating layer; and
   depositing a dielectric material filling the space.

8. The method of claim 6, wherein the partially removing of the first and the second sacrificial layers includes applying a plasma etching process that is tuned to etch the first and the second sacrificial layers but not the third sacrificial layer.

9. The method of claim 6, wherein each of the first, second, and third sacrificial layers includes silicon germanium, and the third sacrificial layer includes germanium at a lower atomic percent than the first and the second sacrificial layers.

10. A method, comprising:
    forming a fin structure over a substrate, wherein the fin structure includes a base layer, a first sacrificial layer over the base layer, an isolating layer over the first sacrificial layer, and a stack of channel layers and second sacrificial layers alternately stacked over the isolating layer, wherein the first sacrificial layer includes a different material than the base layer, the isolating layer, the channel layers, and the second sacrificial layers;
    forming an isolation structure adjacent to sidewalls of the fin structure, wherein a top surface of the isolation structure is above a top surface of the first sacrificial layer and below a top surface of the isolating layer;
    depositing a third sacrificial layer over the isolation structure and over the sidewalls of the fin structure, wherein the third sacrificial layer includes a different material than the first sacrificial layer;
    etching the third sacrificial layer and the fin structure to form two source/drain trenches, wherein the source/drain trenches expose the base layer, and a portion of the first sacrificial layer is interposed between the source/drain trenches; and
    replacing the portion of the first sacrificial layer with a dielectric cap.

11. The method of claim 10, before the replacing, further comprising:
    partially removing the second and the third sacrificial layers through the source/drain trenches to form gaps; and
    depositing a dielectric spacer in the gaps.

12. The method of claim 11, wherein the replacing includes:
    removing the first sacrificial layer with a first plasma etching process, resulting in space vertically between the base layer and the isolating layer; and
    depositing a dielectric material filling the space.

13. The method of claim 12, wherein the partially removing the second and the third sacrificial layers includes applying a second plasma etching process that is tuned to etch the second and the third sacrificial layers but not the first sacrificial layer.

14. The method of claim 13, wherein both the first and the second plasma etching processes apply a fluorine-based plasma.

15. The method of claim 10, wherein the isolating layer includes silicon or a dielectric material.

16. The method of claim 10, after the replacing, further comprising:
    epitaxially growing source/drain features in the source/drain trenches; and
    forming a contact structure connecting to the source/drain features, wherein a portion of the contact structure is disposed below the isolating layer.

17. A semiconductor structure, comprising:
a source/drain feature;
channel layers connecting to the source/drain feature;
a gate structure adjacent to the source/drain feature and engaging each of the channel layers;
an isolating layer directly below the channel layers;
a contact structure connecting to the source/drain feature, wherein a portion of the contact structure is directly below the isolating layer and directly below the gate structure; and
an isolation structure adjacent to the contact structure and below the gate structure, wherein a top surface of the isolation structure is below a top surface of the isolating layer and above a bottom surface of the isolating layer.

18. The semiconductor structure of claim 17, wherein the isolating layer includes silicon or a dielectric material.

19. The semiconductor structure of claim 17, wherein the isolating layer has a thickness in a range of about 8 nm to about 40 nm.

20. The semiconductor structure of claim 17, further comprising a dielectric cap between the isolating layer and the contact structure.

\* \* \* \* \*